(12) United States Patent
Lee et al.

(10) Patent No.: US 12,401,353 B2
(45) Date of Patent: Aug. 26, 2025

(54) MEMORY DEVICE AND OPERATING METHOD OF A MEMORY DEVICE

(71) Applicant: SAMSUNG ELECTRONICS CO., LTD., Suwon-si (KR)

(72) Inventors: Mingyu Lee, Suwon-si (KR);
Youngchul Cho, Suwon-si (KR);
Seungjin Park, Suwon-si (KR);
Youngdon Choi, Suwon-si (KR);
Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/219,254

(22) Filed: Jul. 7, 2023

(65) Prior Publication Data

US 2023/0353132 A1 Nov. 2, 2023

Related U.S. Application Data

(63) Continuation of application No. 17/695,168, filed on Mar. 15, 2022, now Pat. No. 11,736,097.

(30) Foreign Application Priority Data

Sep. 6, 2021 (KR) .................. 10-2021-0118258

(51) Int. Cl.
*H03K 5/00* (2006.01)
*H03K 5/05* (2006.01)
(Continued)

(52) U.S. Cl.
CPC .............. *H03K 5/06* (2013.01); *H03K 5/05* (2013.01); *H03K 5/065* (2013.01); *H03K 5/1506* (2013.01); *H03K 5/1508* (2013.01)

(58) Field of Classification Search
CPC ............ H03K 5/06; H03K 5/065; H03K 5/05; H03K 5/1506; H03K 5/1508
See application file for complete search history.

(56) References Cited

U.S. PATENT DOCUMENTS

| 6,714,039 B2 | 3/2004 | Salcido et al. |
| 6,963,235 B2 | 11/2005 | Lee |

(Continued)

FOREIGN PATENT DOCUMENTS

| KR | 10-2009-0009557 A | 1/2009 |
| KR | 1020210004551 A | 1/2021 |

OTHER PUBLICATIONS

Extended European Search Report dated Dec. 21, 2022.
European Search Report dated Jul. 5, 2024 for corresponding EP Patent Application No. 22180537.7.

*Primary Examiner* — Tuan T Lam
(74) *Attorney, Agent, or Firm* — Muir Patent Law, PLLC

(57) ABSTRACT

A clock signal delay path unit includes a first delay cell including a first root signal line for delaying and transmitting a clock signal, a first repeater to transmit the clock signal transmitted through the first root signal line without signal attenuation, and a second root signal line for delaying and transmitting the clock signal output from the first repeater, a second delay cell including a first inverting circuit configured to invert the clock signal provided from the first delay cell to generate an inverted clock signal, and a third delay cell including a first branch signal line for delaying and transmitting the inverted clock signal provided from the second delay cell, a second repeater to transmit the inverted clock signal transmitted through the first branch signal line, and a second branch signal line for delaying and transmitting the inverted clock signal output from the second repeater.

18 Claims, 21 Drawing Sheets

(51) Int. Cl.
    *H03K 5/06* (2006.01)
    *H03K 5/15* (2006.01)

(56) References Cited

U.S. PATENT DOCUMENTS

| | | |
|---|---|---|
| 7,564,284 B2 | 7/2009 | Henzler et al. |
| 7,629,824 B2 | 12/2009 | Cho |
| 7,633,329 B2 | 12/2009 | Park |
| 7,683,725 B2 | 3/2010 | Kim et al. |
| 7,737,540 B2 | 6/2010 | Choi |
| 8,283,960 B2 | 10/2012 | Le et al. |
| 8,836,402 B2 | 9/2014 | Han |
| 9,154,291 B2 | 10/2015 | Yamaguchi |
| 10,466,739 B1 | 11/2019 | Heo |
| 10,840,920 B2 | 11/2020 | Zerbe et al. |
| 11,183,993 B2 | 11/2021 | Shin et al. |
| 2007/0090867 A1 | 4/2007 | Kim |
| 2018/0101192 A1* | 4/2018 | Mazzucchelli ..... G06F 13/4282 |
| 2019/0132813 A1 | 5/2019 | Jiang et al. |
| 2021/0006254 A1 | 1/2021 | Kim et al. |
| 2022/0052678 A1* | 2/2022 | Choi ..................... G11C 8/10 |
| 2023/0179193 A1* | 6/2023 | Kim ..................... G11C 29/028 |
| | | 327/261 |
| 2023/0267978 A1* | 8/2023 | Yasuda ................ G11C 29/028 |
| | | 365/116 |

\* cited by examiner

MEMORY DEVICE AND OPERATING METHOD OF A MEMORY DEVICE

CROSS-REFERENCE TO THE RELATED APPLICATIONS

This is a continuation application based on pending application Ser. No. 17/695,168, filed Mar. 15, 2022, the entire contents of which is hereby incorporated by reference.

This application claims priority from Korean Patent Application No. 10-2021-0118258, filed Sep. 6, 2021, in the Korean Intellectual Property Office, the disclosure of which is incorporated herein by reference in its entirety.

BACKGROUND

1. Field

Embodiments relate to a clock signal delay path unit and a semiconductor memory device including the same.

2. Description of the Related Art

A semiconductor memory device may include a delay locked loop circuit. The delay locked loop circuit may include a delay locked loop and a clock signal delay path unit. The delay locked loop may generate a delayed clock signal that is delay-locked to an external clock signal. The clock signal delay path unit may delay the delayed clock signal by the same delay time through signal lines to generate internal clock signals and transmit the internal clock signals to target blocks (e.g., data strobe signal drivers and data drivers).

SUMMARY

A clock signal delay path unit in accordance with an embodiment may include at least one first delay cell including a first root signal line for delaying and transmitting a clock signal, a first repeater for transmitting the clock signal transmitted through the first root signal line without signal attenuation, and a second root signal line for delaying and transmitting the clock signal output from the first repeater, a second delay cell including a first inverting circuit for inverting the clock signal provided from the first delay cell to generate an inverted clock signal, and at least one third delay cell including a first branch signal line for delaying and transmitting the inverted clock signal provided from the second delay cell, a second repeater for transmitting the inverted clock signal transmitted through the first branch signal line without signal attenuation, and a second branch signal line for delaying and transmitting the inverted clock signal output from the second repeater, wherein each of the first root signal line, the second root signal line, the first branch signal line, and the second branch signal line may be a long metal line.

A semiconductor memory device in accordance with an embodiment may include a clock signal input buffer configured to buffer an external clock signal applied from the outside and to output a buffered clock signal, a delay locked loop configured to receive the buffered clock signal and to generate a delayed clock signal delay-locked to the external clock signal, a clock signal delay path unit configured to delay and invert the delayed clock signal to generate n internal clock signals, a data strobe signal, and an inverted data strobe signal, a memory cell array including a plurality of memory cells and outputting data stored in memory cells selected in response to a plurality of word line selection signals and a plurality of column selection signals, a data read path unit configured to receive the data and to convert the data into serial data to generate n pieces of data, a data output unit configured to drive the n pieces of data in response to the n internal clock signals, and a data strobe signal output unit configured to drive the output data strobe signal and the inverted output data strobe signal, wherein the clock signal delay path unit includes n+2 branch delay units each including at least one first delay cell including a first root signal line for delaying and transmitting the delayed clock signal, a first repeater configured to transmit the delayed clock signal transmitted through the first root signal line without signal attenuation, and a second root signal line for delaying and transmitting the delayed clock output from the first repeater, a second delay cell including a first inverting circuit configured to invert the delayed clock signal provided from the first delay cell to generate an inverted delayed clock signal, and at least one third delay cell including a first branch signal line for delaying and transmitting the inverted delayed clock signal provided from the second delay cell, a second repeater configured to transmit the inverted delayed clock signal transmitted through the first branch signal line without signal attenuation, and a second branch signal line for delaying and transmitting the inverted delay clock signal output from the second repeater, wherein each of the first root signal line, the second root signal line, the first branch signal line, and the second branch signal line may be a long metal line, and the n+2 branch delay units may generate the n internal clock signals, the output data strobe signal, and the inverted output data strobe signal.

A semiconductor memory device in accordance with an embodiment may include a read enable signal input buffer configured to buffer a read enable signal applied from the outside and to output a buffered read enable signal, an inverted read enable signal input buffer configured to buffer an inverted read enable signal applied from the outside and to output a buffered inverted read enable signal, a read enable signal delay path configured to delay and invert the buffered read enable signal and the buffered inverted read enable signal to generate n internal clock signals, an output data strobe signal, and an inverted output data strobe signal, a memory cell array including a plurality of memory cells and outputting data stored in memory cells selected in response to a plurality of word line selection signals, a plurality of source line selection signals, a plurality of ground selection signals, and a plurality of column selection signals, a page buffer configured to buffer the data to generate read data; a data read path unit configured to receive the read data and to convert the data into serial data to generate n pieces of data, a data output unit configured to drive the n pieces of data in response to the n internal clock signals, and a data strobe signal output unit configured to drive the output data strobe signal and the inverted output data strobe signal, wherein the read enable signal delay path includes n+2 branch delay units each including at least one first delay cell including a first root signal line pair for delaying and transmitting a read enable signal pair including the buffered read enable signal and the buffered inverted read enable signal, a first repeater configured to transmit the read enable signal pair transmitted through the first root signal line pair without signal attenuation, and a second root signal line pair for delaying and transmitting the read enable signal pair output from the first repeater, a second delay cell including a first inverting circuit configured to invert the read enable signal pair provided from the first delay cell and to output an inverted read enable signal pair, and at least one third delay cell including a first branch signal line pair for delaying and transmitting the inverted read enable signal pair provided from the second delay cell, a second repeater configured to transmit the inverted read enable signal pair transmitted through the first branch signal line pair without signal attenuation, and a second branch signal line pair for delaying and transmitting the inverted read enable signal pair output from the second repeater, wherein each of the first root signal line pair, the second root signal line pair, the first branch signal line pair, and the second branch signal line pair may be a long metal line pair, and the n+2 branch delay units may generate the n internal clock signals, the output data strobe signal, and the inverted output data strobe signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
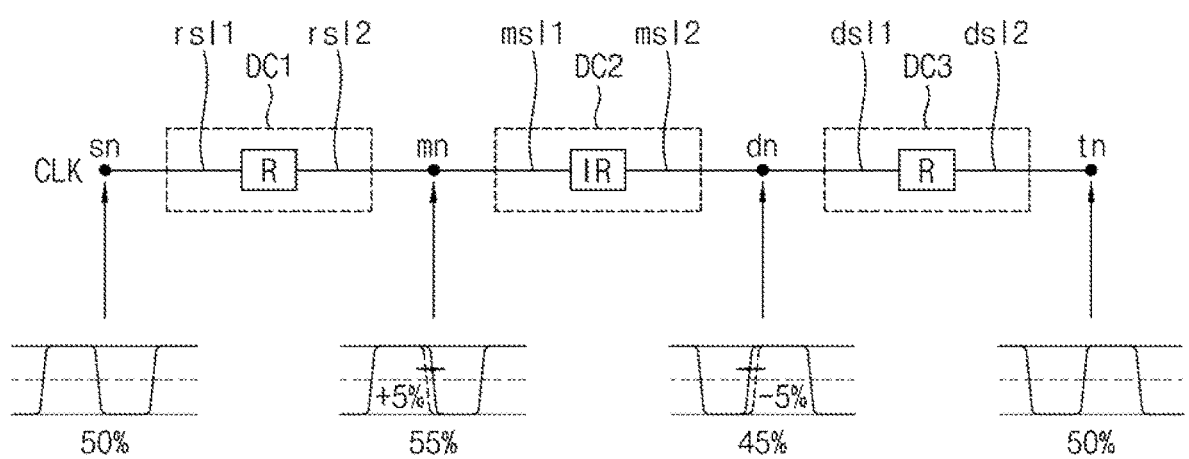
FIG. 1 is a diagram showing a clock signal delay path unit according to an example embodiment.

FIG. 1 is a diagram showing a clock signal delay path unit according to an example embodiment. The configuration and operation of the clock signal delay path unit will be described with reference to FIG. 1 as follows.

The clock signal delay path unit may include a first delay cell DC1, a second delay cell DC2, and a third delay cell DC3.

The first delay cell DC1 may include a first root signal line rsl1 that delays and transmits a clock signal CLK, a repeater R that transmits the clock signal transmitted through the first root signal line rsl1 without signal attenuation, and a second root signal line rsl2 that delays and transmits the clock signal output from the repeater R.

Each of the first and second root signal lines rsl1 and rsl2 may be a long metal line.

A duty ratio of the clock signal CLK transmitted through the first delay cell DC1 may vary according to changes in process, voltage, and temperature (PVT). For example, although the duty ratio of the clock signal CLK applied to a start node sn is 50%, the duty ratio may increase by 5% while the clock signal CLK passes through the first delay cell DC1, and thus the duty ratio of the clock signal CLK generated at an intermediate node mn may reach 55%.

The second delay cell DC2 may include a first intermediate signal line msl1 that delays and transmits the clock signal CLK provided from the first delay cell DC1, an inverting repeater IR that inverts the clock signal CLK transmitted through the first intermediate signal line msl1 to generate an inverted clock signal and transmits the inverted clock signal without signal attenuation, and a second intermediate signal line msl2 that delays and transmits the inverted clock signal output from the inverting repeater IR.

The inverting repeater IR may include an inverting circuit (not shown) and a repeater R (not shown) connected in series.

In an example embodiment, the second delay cell DC2 may be implemented as an inverting circuit (not shown). For example, the second delay cell DC2 may not include the first intermediate signal line msl1 and the second intermediate signal line msl2 which are long metal lines, and the repeater R.

The second delay cell DC2 may invert the phase of the clock signal CLK having a duty ratio increased by the first delay cell DC1. Accordingly, the duty ratio of the inverted clock signal output from the second delay cell DC2 may vary. For example, when the phase of the clock signal CLK having a duty ratio of 55% is inverted by the second delay cell DC2, the duty ratio of the inverted clock signal may become 45%. Accordingly, the duty ratio of the inverted clock signal may be decreased at a branch node dn.

The third delay cell DC3 may include a first branch signal line dsl1 that delays and transmits the inverted clock signal provided from the second delay cell DC2, a repeater R that transmits the inverted clock signal provided through the first branch signal line dsl1 without signal attenuation, and a second branch signal line dsl2 that delays and transmits the inverted clock signal output from the repeater R.

Each of the first branch signal line dsl1 and the second branch signal line dsl2 may be a long metal line.

As in the first delay cell DC1, the duty ratio of the inverted clock signal transmitted through the third delay cell DC3 may vary due to change in PVT. For example, although the duty ratio of the inverted clock signal applied to the branch node dn is 45%, the duty ratio may increase by 5% while the inverted clock signal passes through the third delay cell DC3, and thus the duty ratio of the inverted clock signal may reach 50% at a target node.

In the clock signal delay path unit according to an example embodiment, even if the duty ratio of the clock signal CLK is increased or decreased by the first delay cell DC1 and the second delay cell DC2 due to change in PVT, the phase of the clock signal CLK is inverted and thus the duty ratio of the clock signal CLK transmitted through the clock signal delay path unit may be maintained constant. That is, the duty ratio of the clock signal CLK input to the clock signal delay path unit may be substantially the same as the duty ratio of the clock signal CLK output from the clock signal delay path unit. For example, when the duty ratio of the clock signal CLK input to the clock signal delay path unit is 50%, the duty ratio of the clock signal CLK output from the clock signal delay path unit may be 50%. As shown in FIG. 1, even if the duty ratio of the clock signal CLK is increased by a predetermined percentage (e.g., 5%) through the first delay cell DC1 and the third delay cell DC3, the duty ratio of the clock signal CLK may be corrected by inverting the clock signal CLK through the second delay cell DC2 such that the duty ratio of the clock signal CLK output from the third delay cell DC3 becomes a desired duty ratio (e.g., 50%).

Although FIG. 1 shows that each of the first delay cell DC1 and the third delay cell DC3 includes a single repeater R, this is merely an example and, e.g., each of the first and third delay cells DC1 and DC3 may include a plurality of repeaters. In this case, the number of repeaters included in the first delay cell DC1 may be equal to the number of repeaters included in the third delay cell DC3.

Also, although FIG. 1 illustrates that the duty ratio is increased by the delay cells of the clock signal delay path part, the duty ratio of the clock signal CLK may be corrected by inverting the clock signal CLK even when the duty ratio is decreased by the delay cells.

In an example embodiment, each repeater R may include an even number of inverting circuits connected in series.

In an example embodiment, the long metal line may be implemented such that the length of the long metal line is greater than the length of a signal line between inverting circuits constituting the repeater R.

In FIG. 1, since the phase of the inverted clock signal generated at a target node tn has the inverted phase of the clock signal CLK, an inverting circuit for inverting the phase of the clock signal CLK may be added to a stage before the start node sn, or an inverting circuit for inverting the phase of the inverted clock signal may be added to a stage subsequent to the target node tn, in order to restore the phase of the clock signal CLK.

Figure 2A:
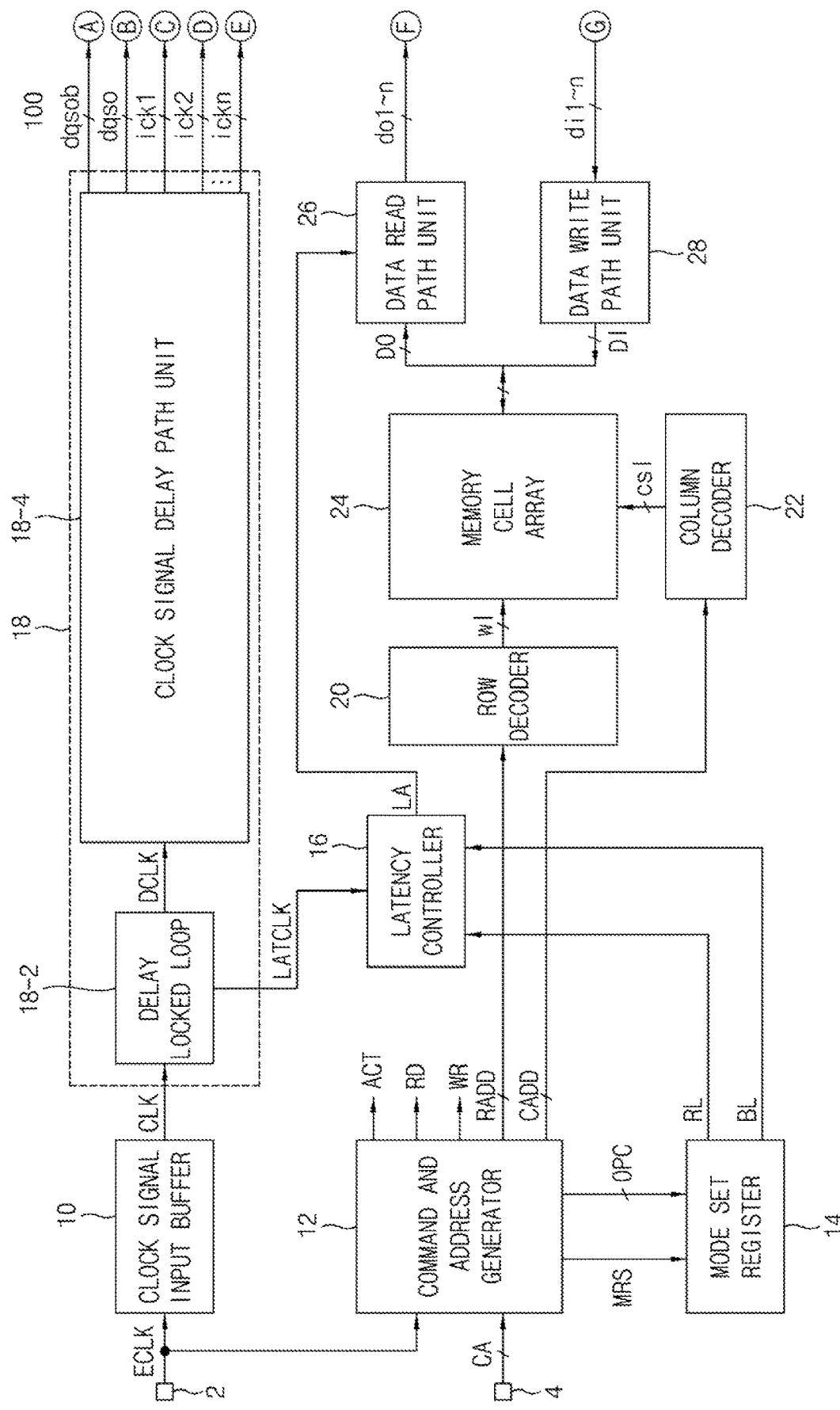
FIG. 2A and FIG. 2B are block diagrams of a semiconductor memory device according to an example embodiment.
Figure 2B:
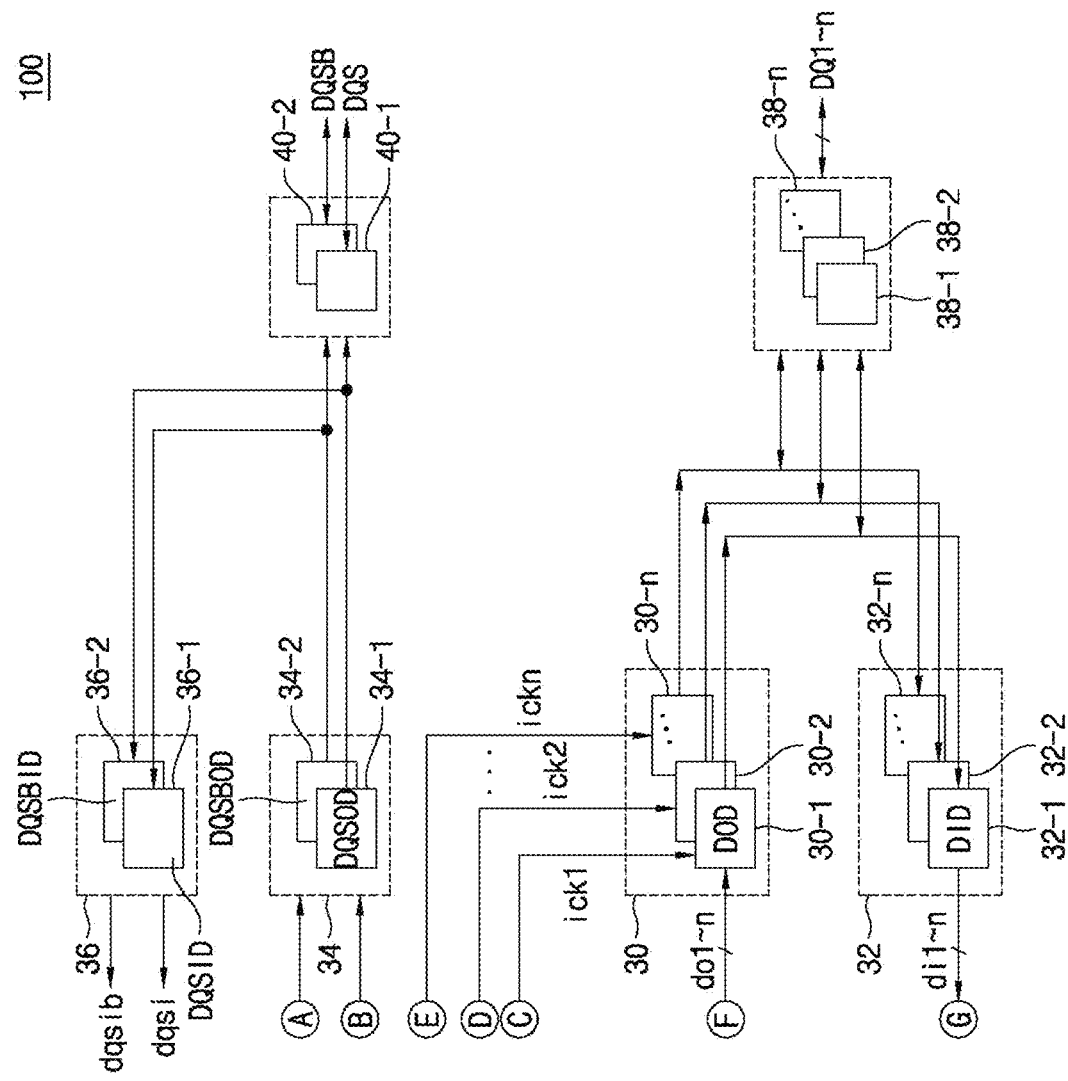

FIG. 2A and FIG. 2B are block diagrams of a semiconductor memory device according to an example embodiment.

Referring to FIGS. 2A and 2B, a semiconductor memory device 100 may include a clock signal terminal 2, command and address terminals 4, a clock signal input buffer 10, a command and address generator 12, a mode set register 14, a latency controller 16, a delay locked loop circuit 18, a row decoder 20, a column decoder 22, a memory cell array 24, a data read path unit 26, a data write path unit 28, a data output unit 30, a data input unit 32, a data strobe signal output unit 34, a data strobe signal input unit 36, data terminals 38-1 to 38-n, a data strobe signal terminal 40-1, and an inverted data strobe signal terminal 40-2.

The delay locked loop circuit 18 may include a delay locked loop 18-2 and a clock signal delay path unit 18-4.

The data output unit 30 may include n data output drivers (DODs) 30-1 to 30-n.

The data input unit 32 may include n data input drivers (DIDs) 32-1 to 32-n.

The data strobe signal output unit 34 may include a data strobe signal output driver (DQSOD) 34-1 and an inverted data strobe signal output driver (DQSBOD) 34-2.

The data strobe signal input unit 36 may include a data strobe signal input driver (DQSID) 36-1 and an inverted data strobe signal input driver (DQSBID) 36-2.

The function of each block shown in FIG. 2A and FIG. 2B will be described as follows.

The clock signal terminal 2 may receive an external clock signal ECLK. The command and address terminals 4 may receive a command and address CA.

The clock signal input buffer 10 may buffer the external clock signal ECLK, and output a buffered clock signal CLK.

The command and address generator 12 may decode a command signal included in the command and address CA in response to the external clock signal ECLK, to generate an active command ACT, a write command WR, a read command RD, and a mode set command MRS. In addition, the command and address generator 12 may receive an address signal included in the command and address CA, to generate a row address RADD along with the active command ACT, generate a column address CADD along with the write command WR or the read command RD, and generate a mode set code OPC along with the mode set command MRS.

The mode set register 14 may store the mode set code OPC in response to the mode set command MRS, and set a read latency RL and a burst length BL.

The latency controller 16 may receive the read command RD in response to a latency clock signal LATCLK, and generate a latency control signal LA that is activated after the number of clock cycles corresponding to the read latency RL and deactivated after the number of clock cycles corresponding to the burst length BL.

The delay locked loop 18-2 may receive the buffered clock signal CLK, generate a delayed clock signal DCLK that is delay-locked to the external clock signal ECLK, and additionally generate the latency clock signal LATCLK.

The clock signal delay path unit 18-4 may transmit the delayed clock signal DCLK to generate an output data strobe signal dqso, an inverted output data strobe signal dqsob, and n internal clock signals ick1 to ickn locked to the external clock signal ECLK. The clock signal delay path unit 18-4 may correct a change in the duty ratio of the delayed clock signal DCLK, which may occur due to change in PVT in signal lines for transmitting the delayed clock signal DCLK. For example, the clock signal delay path unit 18-4 may decrease (or increase) the duty ratio of the delayed clock signal DCLK to correct the duty ratio by inverting the phase of the delayed clock signal DCLK at midpoints of the signal lines even if the duty ratio of the delayed clock signal DCLK increases (or decreases) due to change in PVT in the signal lines. Accordingly, the duty ratios of the output data strobe signal dqso, the inverted output data strobe signal dqsob, and the n internal clock signals ick1 to ickn generated by the clock signal delay path unit 18-4 may be corrected.

The row decoder 20 may generate a plurality of word line selection signals w1 by decoding the row address RADD.

The column decoder 22 may generate a plurality of column selection signals csl by decoding the column address CADD.

The memory cell array 24 may include a plurality of memory cells (not shown), and may output read data DO from memory cells selected in response to the plurality of word line selection signals w1 and the plurality of column selection signals csl, or may store write data DI in selected memory cells. Each of the plurality of memory cells may be a dynamic memory cell, the memory cell array 24 may be a dynamic memory cell array, and the semiconductor memory device 100 may be a dynamic random access memory (DRAM) device.

The data read path unit 26 may serially convert the read data DO, to generate n pieces of output data do1 to don. The n pieces of output data do1 to don may be generated during an activation period of the latency control signal LA. For example, when 8n-bit read data DO is input, n pieces of output data do1 to don may be output eight times by 1 bit.

The data write path unit 28 may convert n pieces of input data di1 to din in parallel to generate write data DI. For example, when the n pieces of input data di1 to din are input eight times by 1 bit, 8n-bit write data DI may be generated.

The data output drivers 30-1 to 30-n may be connected to the n data terminals 38-1 to 38-n, and may drive the n pieces of output data do1 to don in response to the internal clock signals ick1 to ickn to generate n pieces of data DQ1 to DQn, respectively.

The data input drivers 32-1 to 32-n may be connected to the n data terminals 38-1 to 38-n, and may drive the n pieces of data DQ1 to DQn to generate n pieces of input data di1 to din, respectively.

The data strobe signal output driver 34-1 may be connected to the data strobe signal terminal 40-1, and may drive the output data strobe signal dqso to generate a data strobe signal DQS. The inverted data strobe signal output driver 34-2 may be connected to the inverted data strobe signal terminal 40-2, and may drive the inverted output data strobe signal dqsob to generate an inverted data strobe signal DQSB.

The data strobe signal input driver 36-1 may be connected to the data strobe signal terminal 40-1, and may drive the data strobe signal DQS applied from the outside to generate an input data strobe signal dqsi. The inverted data strobe signal input driver 36-2 may be connected to the inverted data strobe signal terminal 40-2, and may drive the inverted input data strobe signal DQSB applied from the outside to generate an inverted input data strobe signal dqsib.

Figure 3:
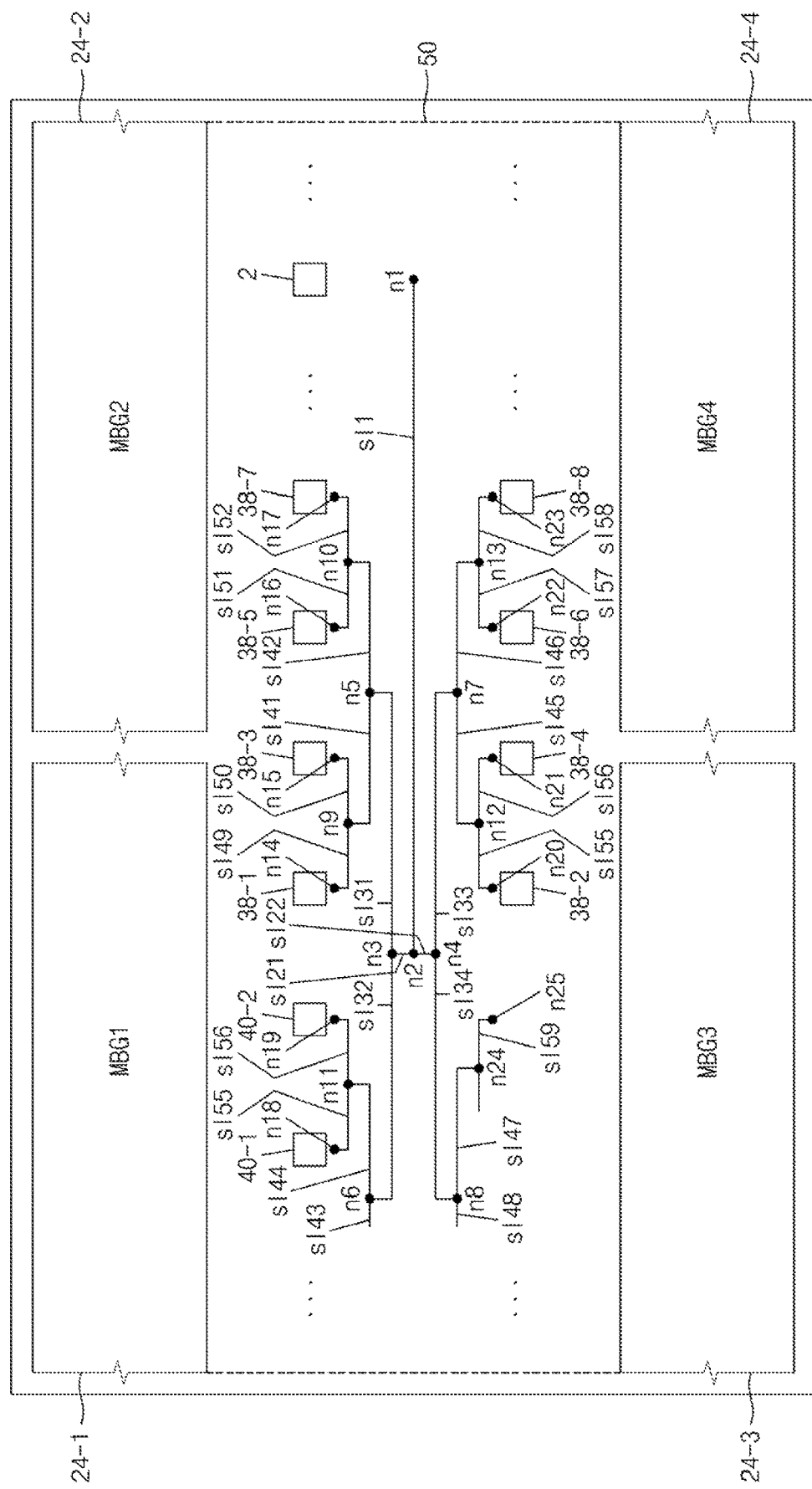
FIG. 3 is a diagram showing an arrangement of the semiconductor memory device according to an example embodiment.
Figure 4:
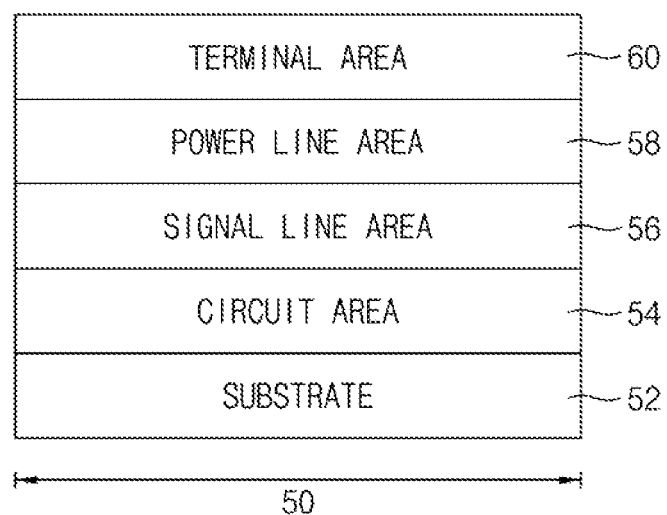
FIG. 4 is a diagram showing a vertical arrangement of a peripheral circuit area according to an example embodiment.

FIG. 3 is a diagram showing an arrangement of the semiconductor memory device according to an example embodiment. FIG. 4 is a diagram showing a vertical arrangement of a peripheral circuit area according to an example embodiment.

Referring to FIG. 3, the semiconductor memory device 100 may include memory cell array areas 24-1 to 24-4, and a peripheral circuit area 50.

Referring to FIG. 2A, FIG. 2B, and FIG. 3, the memory cell array 24 may include, e.g., four memory bank groups MBG1 to MBG4. The memory bank groups MBG1 to MBG4 may be respectively disposed in the memory cell array areas 24-1 to 24-4. In addition, a row decoder 20 and a column decoder 22 for each of the memory bank groups MBG1 to MBG4 may be additionally disposed in each of the memory cell array areas 24-1 to 24-4. Peripheral circuits, e.g., the clock signal input buffer 10, the command and address generator 12, the mode set register 14, the latency controller 16, the delay locked loop circuit 18, the data read path unit 26, the data write path unit 28, the data output unit 30, the data input unit 32, the data strobe signal output unit 34, the data strobe signal input unit 36, the data terminals 38-1 to 38-8, the data strobe signal terminal 40-1, and the inverted data strobe signal terminal 40-2 may be disposed in the peripheral circuit area 50.

Referring to FIG. 2A to FIG. 4, the peripheral circuits may be disposed in a circuit area 54 on a substrate 52. A signal line area 56 may be disposed on the circuit area 54. A power line area 58 may be disposed on the signal line area 56. A terminal area 60 may be disposed on the power line area 58. Signal lines may be arranged in the signal line area 56. Power lines may be arranged in the power line area 58. The data terminals 38-1 to 38-n, the data strobe signal terminal 40-1, and the inverted data strobe signal terminal 40-2 may be arranged in the terminal area 60. The terminals may be pads.

The arrangement of the signal lines of the clock signal delay path unit 18-4 shown in FIG. 3 is an arrangement when the data terminals 38-1 to 38-8, the data strobe signal terminal 40-1, and the inverted data strobe signal terminal 40-2 are disposed adjacently, a clock signal terminal CKP to which the external clock signal ECLK is applied is disposed relatively far away from the data terminals 38-1 to 38-8, the data strobe signal terminal 40-1, and the inverted data strobe signal terminal 40-2, the clock signal input buffer 10 and the delay locked loop 18-2 are disposed adjacent to the clock signal terminal CKP, and the data output drivers 30-1 to 30-8, the data strobe signal output driver 34-1, and the inverted data strobe signal output driver 34-2 are disposed adjacent to the data terminals 38-1 to 38-n, the data strobe signal terminal 40-1, and the inverted data strobe signal terminal 40-2, respectively.

The arrangement of the signal lines of the clock signal delay path unit 18-4 will now be described with further reference to FIG. 2A to FIG. 4.

A first node n1 may be an output node of the delay locked loop 18-2. A second node n2 may be a branch start node. Third and fourth nodes n3 and n4 may be first branch nodes. Fifth to eighth nodes n5 to n8 may be second branch nodes. Ninth to thirteenth nodes n9 to n13 may be third branch nodes. Fourteenth to seventeenth nodes n14 to n17 and twentieth to twenty-third nodes n20 to n23 may be input nodes of the data output drivers 30-1 to 30-8. Eighteenth and nineteenth nodes n18 and n19 may be input nodes of the data strobe signal output driver 34-1 and the inverted data strobe signal output driver 34-2. Twenty-fourth and twenty-fifth nodes n24 and n25 may be additional nodes.

The first node n1 may correspond to the start node sn shown in FIG. 1. The second node n2 may correspond to the branch node dn. The fourteenth to twenty-third nodes n14 to n23 may correspond to target nodes tn.

First signal lines s121 and s122 from the branch start node (the second node n2) to the first branch nodes (the third node n3 and the fourth node n4) may have the same length and width.

Second signal lines s131 and s132 from the first branch node (the third node n3) to the second branch nodes (the fifth node n5 and the sixth node n6) and second signal lines s133 and s134 from the first branch node (the fourth node n4) to the second branch nodes (the seventh node n7 and the eighth node n8) may have the same length and width.

Third signal lines (s141, s142), s144, (s145, s146), and s147 from the second branch nodes (the fifth node n5, the sixth node n6, the seventh node n7, and the eighth node n8) to the corresponding third branch nodes ((the ninth node n9, the tenth node n10), the eleventh node n11, (the twelfth node n12, the thirteenth node n13), and the twenty-fourth node n24) may have the same length and width.

Third signal lines s143 and s148 may or may not have the same length as that of the third signal line s141.

Fourth signal lines (s149, s150), (s151, s152), (s153, s154), (s155, s156), (s157, s158), and s159 from the third branch nodes (the ninth node n9, the tenth node n10, the eleventh node n11, the twelfth node n12, the thirteenth node n13, and twenty-fourth node n24) to the corresponding fourth branch nodes ((the fourteenth node n14, the fifteenth node n15), (the sixteenth node n16, the seventeenth node n17), (the eighteenth node n18, the nineteenth node n19), (the twentieth node n20, the twenty-first node n21), (the twenty-second node n22, the twenty-third node n23), and the twenty-fifth node n25) may have the same length and width.

A root signal line sl1 and the first signal lines s121 and s122 to the fourth signal lines s149 to s159 may be disposed in the signal line area 56. Signal lines disposed in the horizontal direction and signal lines disposed in the vertical direction may be disposed on different layers of the signal line area 56. Although the root signal line sl1 and the first signal lines s121 and s122 to the fourth signal lines s149 to s159 are successively arranged between the first node n1 to the twenty-fifth node n25 in the figure, they may be connected through repeaters (not shown) or components (not shown), and the repeaters or components may be disposed in the circuit area 54.

As described above, the clock signal delay path unit 18-4 may include the two first signal lines s121 and s122 and a maximum of $2^m$ fourth signal lines s149 to s159 that connect the two first branch nodes (the third node n3 and the fourth node n4) to a maximum of $2^m$ fourth branch nodes (the fourteenth to twenty-third nodes n14 to n23 and the twenty-fifth node n25) that are sequentially arranged for branching m times from the branch start node n2 in a tree structure.

Figure 5:
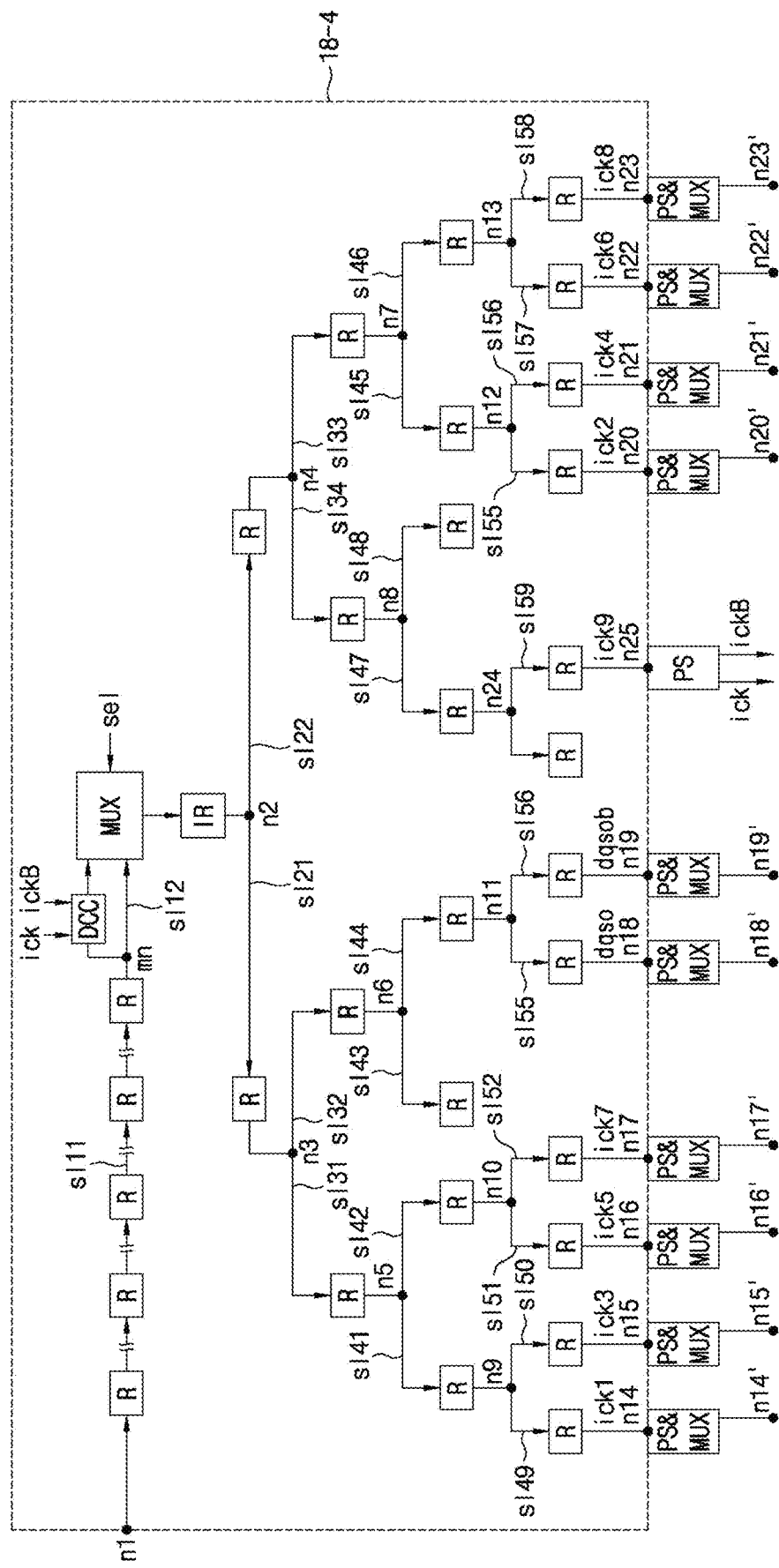
FIG. 5 is a diagram showing a configuration of the clock signal delay path unit according to an example embodiment.

FIG. 5 is a diagram showing a configuration of the clock signal delay path unit according to an example embodiment.

Referring to FIG. 1 and FIG. 5, five repeaters R may be disposed on the root signal line sl11 from the first node n1 to the intermediate node mn. Five first delay cells DC1 may be disposed between the first node n1 and the intermediate node mn. Signal lines between the five repeaters R may correspond to the first root signal line rsl1 or a second root signal line rsl2, and may be long metal lines. The repeaters R may transmit the delayed clock signal DCLK without signal attenuation.

A duty cycle corrector DCC, a multiplexer MUX, and an inverting repeater IR may be disposed between the intermediate signal line sl12 from the intermediate node mn and the second node n2. A configuration between the intermediate node mn and the second node n2 may correspond to the second delay cell DC2.

The duty cycle corrector DCC may correct the duty ratio of the delayed clock signal DCLK transmitted from the intermediate node mn using an internal clock signal pair ick and ickB.

The multiplexer MUX may select the delayed clock signal DCLK transmitted from the intermediate node mn, or may select the delayed clock signal DCLK transmitted from the duty cycle corrector DCC, in response to a selection signal sel. The selection signal sel may be additionally set by the mode set code OPC applied to the mode set register 14 shown in FIG. 2A.

The inverting repeater IR may have a configuration in which an inverting circuit (not shown) and a repeater R (not shown) are connected in series. The inverting circuit may invert the phase of the delayed clock signal DCLK transmitted from the multiplexer MUX, to generate an inverted delayed clock signal DCLKB, and the repeater R may transmit the inverted delayed clock signal DCLKB without signal attenuation. In an implementation, a configuration may be employed in which a repeater R (not shown) is not provided between the intermediate node mn and the second node n2.

A repeater R may be disposed on each of the first signal lines s121 and s122 to the fourth signal lines s149 to s159. A branch delay unit including four third delay cells DC3 may be configured in branch signal lines from the second node n2 to the fourth branch node (the fourteenth node n14). Ten branch delay units may be configured from the second node n2 to the fourth branch nodes (the fourteenth node n14 to the twenty-third node n23). Signal lines between the repeaters R may correspond to the first branch signal line dsl1 or the second branch signal line dsl2 and may be long metal lines. That is, each of the first signal lines s121 and s122 to each of the fourth signal lines s149 to s159 may be long metal lines.

Phase splitters PS and selectors MUX may be additionally provided between the fourteenth node n14 to the twenty-third node n23 and the data output drivers 30-1 to 30-8, the data strobe signal output driver 34-1, and the inverted data strobe signal output driver 34-2. The phase splitters PS and selectors MUX may split or invert and split the phases of the internal clock signals ick1 to ick8, the output data strobe signal dqso, and the inverted output data strobe signal dqsob, to alternately output internal clock signal pairs, an output data strobe signal pair, and an inverted output data strobe signal pair having a phase difference of 180 degrees.

A repeater R may be connected between the twenty-fourth node n24 and the twenty-fifth node n25. A phase splitter PS may be connected to the twenty-fifth node n25, and the phase splitter PS may generate an additional internal clock signal pair having a phase difference of 180 degrees by splitting or inverting and splitting the phase of the internal clock signal ick9.

Figure 6:
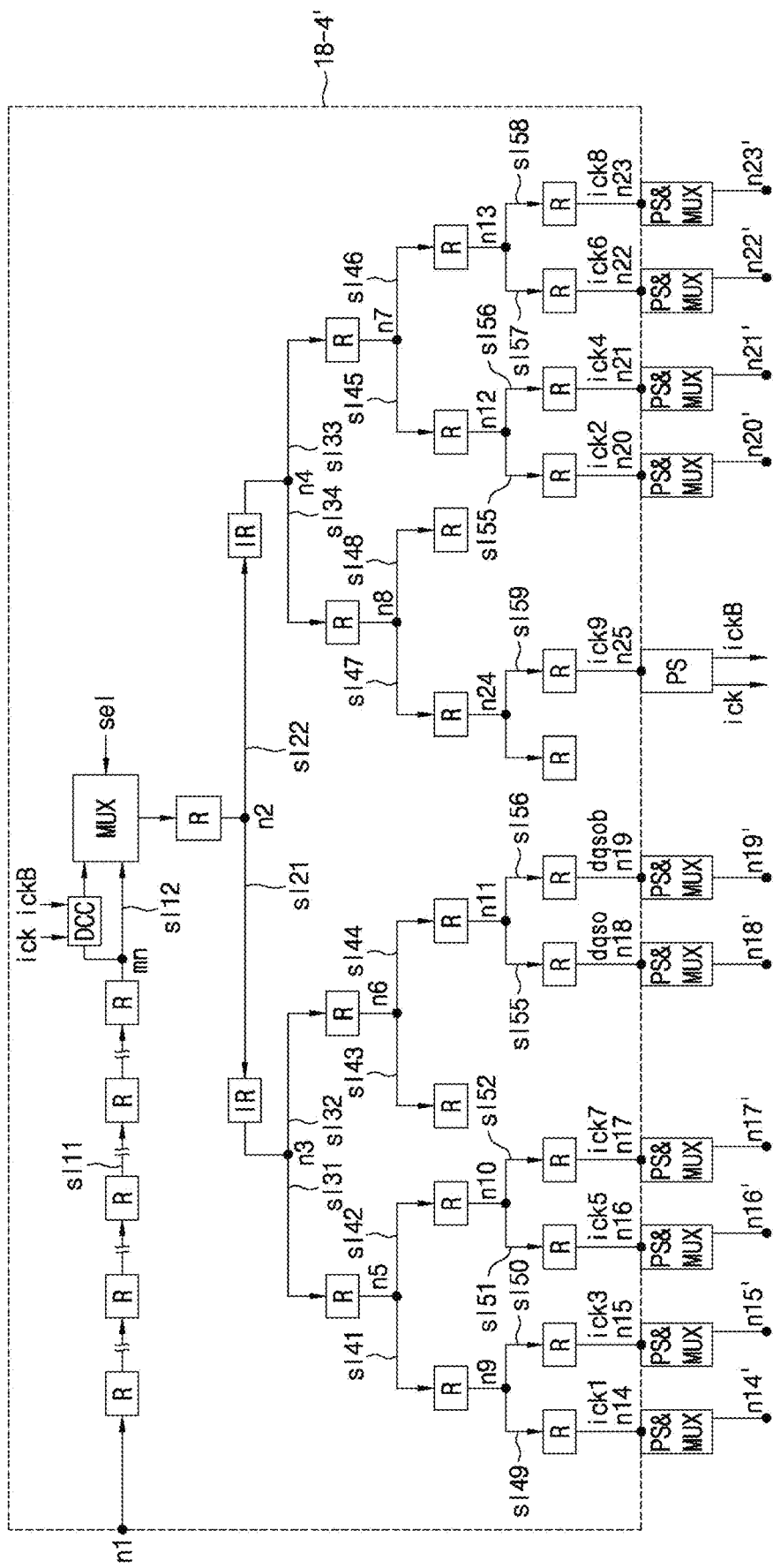
FIG. 6 is a diagram showing a configuration of a clock signal delay path unit according to an example embodiment.

FIG. 6 is a diagram showing a configuration of a clock signal delay path unit according to an example embodiment.

The example embodiment described in connection with FIG. 6 may be the same as that of the clock signal delay path unit 18-4 of FIG. 5 except that the inverting repeater IR provided between the intermediate node mn and the second node n2 in the configuration of FIG. 5 is replaced with a repeater R, and the repeaters R connected between the second node n2, the third node n3, and the fourth node n4 in the configuration of FIG. 5 are replaced with inverting repeaters IR in the clock signal delay path unit 18-4'. The inverting repeater IR may have a configuration in which an inverting circuit (not shown) and a repeater R (not shown) are connected in series.

Referring to FIG. 6, the clock signal delay path unit 18-4' may be configured to invert the phase of the delayed clock signal DCLK immediately after the second node n2 (i.e., the branch start node) instead of inverting the same immediately before the second node n2.

Figure 7:
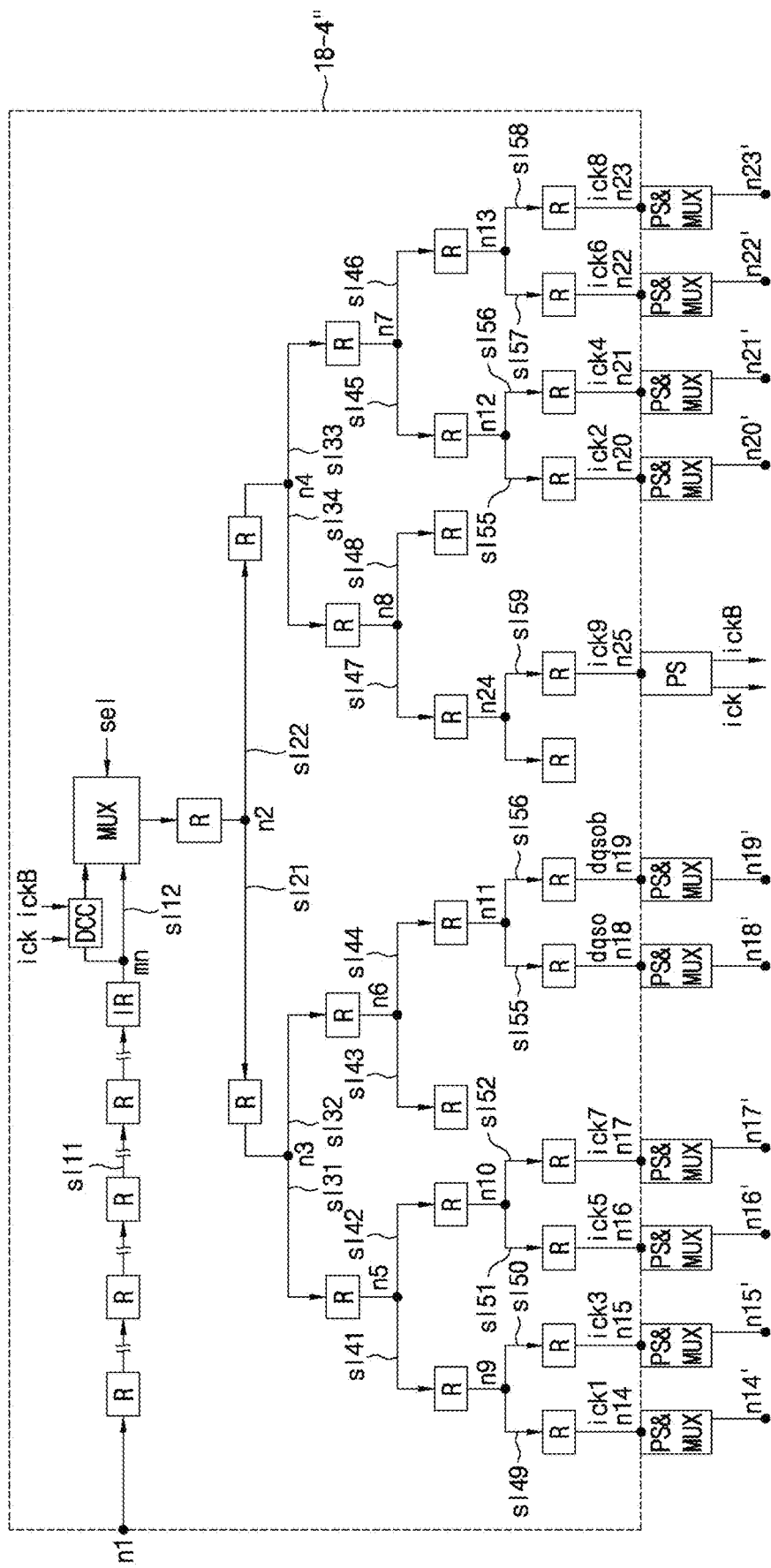
FIG. 7 is a diagram showing a configuration of a clock signal delay path unit according to an example embodiment.

FIG. 7 is a diagram showing a configuration of a clock signal delay path unit according to an example embodiment.

The example embodiment described in connection with FIG. 7 may be the same as the configuration of the clock signal delay path unit 18-4 of FIG. 5 except that the repeater R immediately before the intermediate node mn in the configuration of FIG. 5 is replaced with an inverting repeater IR, and the inverting repeater IR provided between the intermediate node mn and the second node n2 in the configuration of FIG. 5 is replaced with a repeater R in the clock signal delay path unit 18-4".

The inverting repeater IR may have a configuration in which an inverting circuit (not shown) and a repeater R (not shown) are connected in series.

Referring to FIG. 7, the clock signal delay path unit 18-4" may be configured to invert the phase of the delayed clock signal DCLK immediately before the intermediate node mn instead of inverting the same immediately before the second node n2 (i.e., the branch start node).

The phase of the delayed clock signal DCLK is inverted by the inverting repeaters IR in the clock signal delay path units 18-4, 18-4', and 18-4" of FIG. 5 to FIG. 7. To restore the phase of the delayed clock signal DCLK, the delay locked loop 18-2 may be configured to invert the delayed clock signal DCLK in advance, and to apply the inverted delayed clock signal to the first node n1. As another example, the phase splitters PS may be configured to invert the internal clock signals ick1 to ick8, the output data strobe signal dqso, and the inverted output data strobe signal dqsob to perform the above-described phase splitting operation.

In an example embodiment, the inverting repeater IR may be disposed at various positions that are different from the positions in the clock signal delay path units 18-4, 18-4', and 18-4", i.e., different from the above description with reference to FIG. 5 to FIG. 7. For example, repeaters R included in one of a first repeater group including four repeaters R to an m-th repeater group including a maximum of $2^m$ repeaters may be configured as inverting repeaters IR. If change in the total duty ratio that occurs in signal lines from the first node n1 to the fourth branch nodes (the fourteenth node n14 to the twenty-third node n23) is 10% in the clock signal delay path units 18-4, 18-4', and 18-4", the inverting repeater IR for inverting the delayed clock signal DCLK may be provided at a position where change in the duty ratio is 5%.

In an example embodiment, each of the clock signal delay path units 18-4, 18-4', and 18-4" of FIG. 5 to FIG. 7 may be configured except for the duty cycle corrector DCC and the multiplexer MUX. In addition, each of the clock signal delay path units 18-4, 18-4', and 18-4" of FIG. 5 to FIG. 7 may be configured except for the phase splitters PS and selectors MUX. For example, if the semiconductor memory device shown in FIG. 2A and FIG. 2B is configured to output data at a single data rate (SDR) instead of outputting data at a double data rate (DDR), each of the clock signal delay path units 18-4, 18-4', and 18-4" of FIG. 5 to FIG. 7 may be configured except for the phase splitters PS and selectors MUX.

Figure 8A:
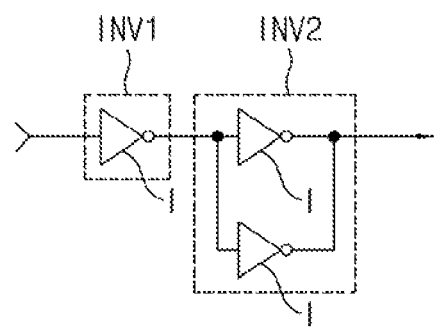
FIG. 8A and FIG. 8B are diagrams showing configurations of a repeater according to an example embodiment.
Figure 8B:
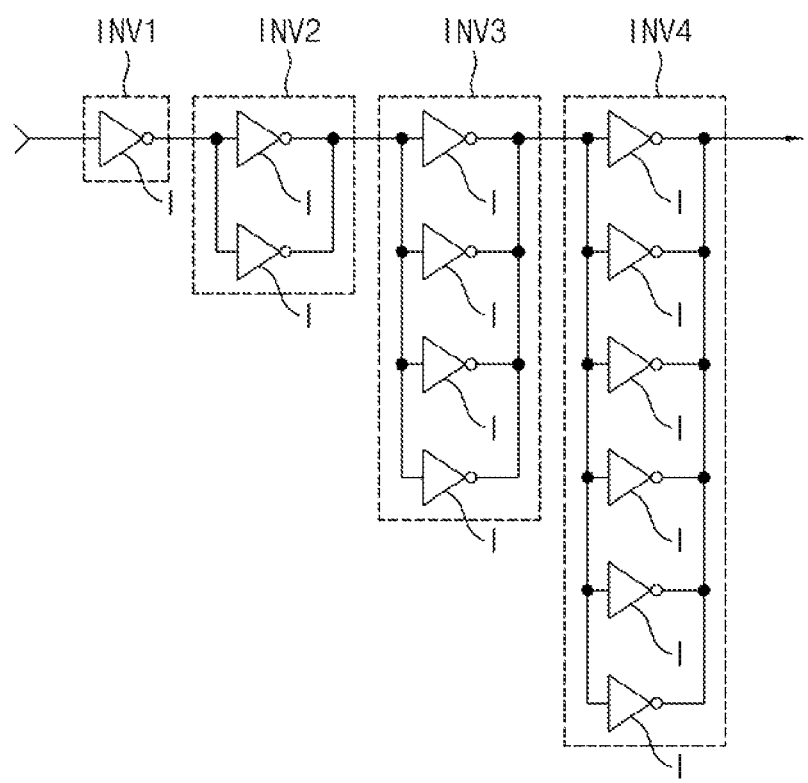

FIG. 8A and FIG. 8B are diagrams showing configurations of a repeater according to an example embodiment.

Referring to FIG. 8A, the repeater R may include two inverting circuits INV1 and INV2 connected in series.

The inverting circuit INV1 may include a single inverter I.

The inverting circuit INV2 may include two inverters I connected in parallel. The inverting circuit INV2 may have a size two times greater than the inverting circuit INV1. In another implementation, the inverting circuit INV2 may have a size three or more times greater than the inverting circuit INV1.

Referring to FIG. 8B, the repeater R may include four inverting circuits INV1 to INV4 connected in series.

The inverting circuit INV1 and the inverting circuit INV2 may have the same configuration as that described with reference to FIG. 8A.

The inverting circuit INV3 may include four inverters I connected in parallel. The inverting circuit INV3 may have a size four times greater than the inverting circuit INV1.

The inverting circuit INV4 may include six inverters I connected in parallel. The inverting circuit INV4 may have a size six times greater than the inverting circuit INV1.

In another implementation, unlike what is shown, the inverting circuit INV1 and the inverting circuit INV2 may have the same size, the inverting circuit INV3 may have a size two or more times greater than the inverting circuit INV1, and the inverting circuit INV4 may have a size three or more times greater than the inverting circuit INV1.

As described with reference to FIG. 8A and FIG. 8B, the repeater R may include an even number of inverting circuits connected in series, and may be configured such that the size of an inverting circuit is the same as or greater than the size of the inverting circuit in the previous stage. The repeater R shown in FIG. 8A and FIG. 8B may drive the delayed clock signal DCLK to generate the delayed clock signal DCLK having the same phase without signal attenuation.

Figure 9A:
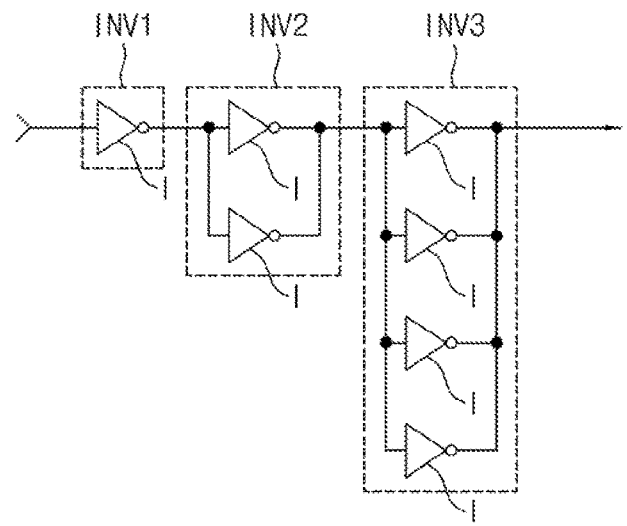
FIG. 9A and FIG. 9B are diagrams showing configurations of an inverting repeater according to an example embodiment.
Figure 9B:
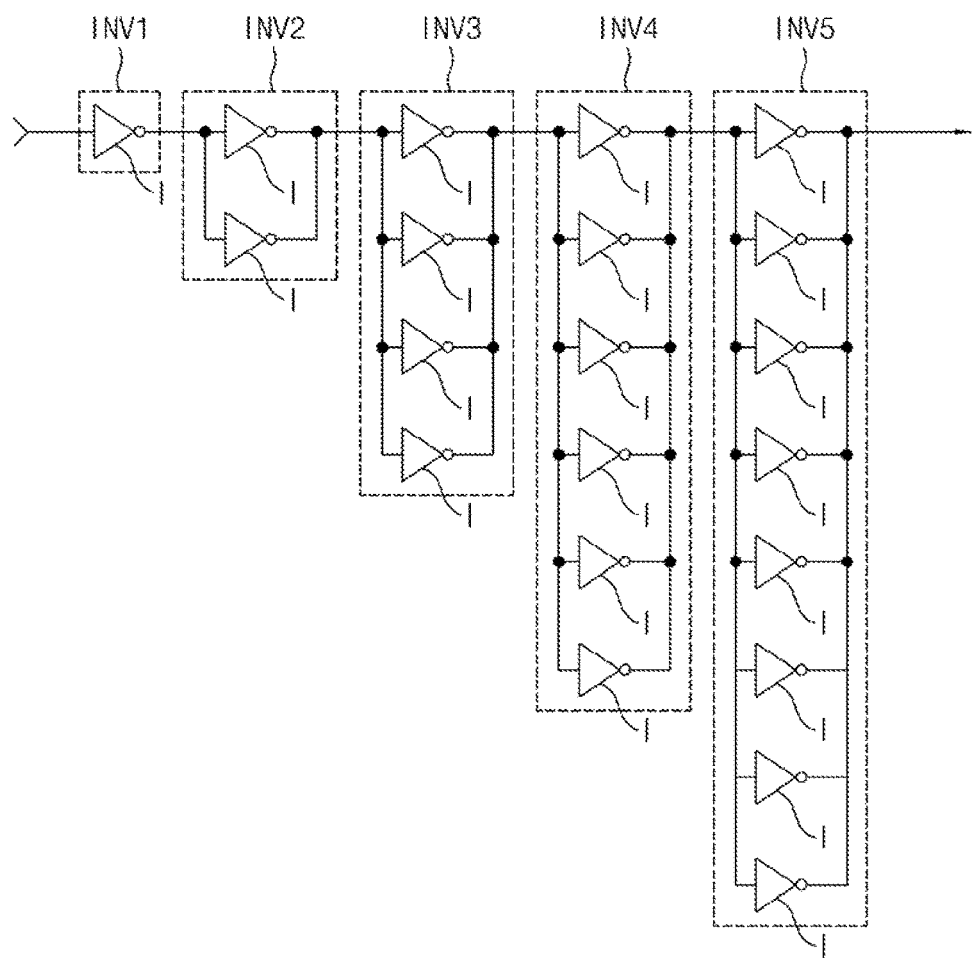

FIG. 9A and FIG. 9B are diagrams showing configurations of an inverting repeater according to an example embodiment.

Referring to FIG. 9A, the inverting repeater IR may have a configuration in which an inverting circuit INV3 is added to the configuration of the repeater R of FIG. 8A.

Referring to FIG. 9B, the inverting repeater IR may have a configuration in which an inverting circuit INV5 is added to the configuration of the repeater R of FIG. 8B.

As described with reference to FIG. 9A and FIG. 9B, the inverting repeater IR may include an odd number of inverting circuits connected in series, and may be configured such that the size of an inverting circuit is the same as or greater than the size of the inverting circuit in the previous stage.

The inverting repeater IR shown in FIG. 9A and FIG. 9B may drive the delayed clock signal DCLK to generate the inverted delayed clock signal DCLKB having an opposite phase.

According to an example embodiment, the length of a signal line between inverting circuits of each of the repeaters R and each of the inverting repeaters IR shown in FIG. 8A to FIG. 9B may be less than the length of the signal line between repeaters R shown in FIG. 5, FIG. 6, and FIG. 7.

Figure 10:
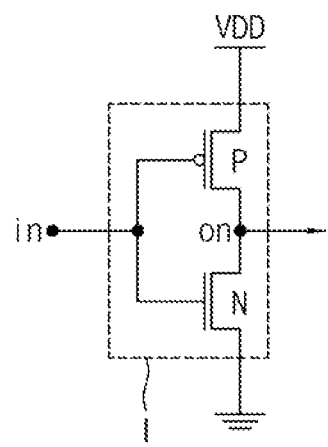
FIG. 10 is a diagram showing a configuration of an inverter of a repeater according to an example embodiment.

FIG. 10 is a diagram showing a configuration of an inverter of a repeater according to an example embodiment.

Referring to FIG. 10, the inverter I may include a PMOS transistor P (having a source connected to a power supply voltage VDD, a gate connected to an input node in, and a drain connected to an output node on) and an NMOS transistor N (having a source connected to a ground voltage, a gate coupled to the input node in, and a drain coupled to the output node on). The inverter I may invert a signal applied to the input node in, and output an inverted signal through the output node on.

Figure 11:
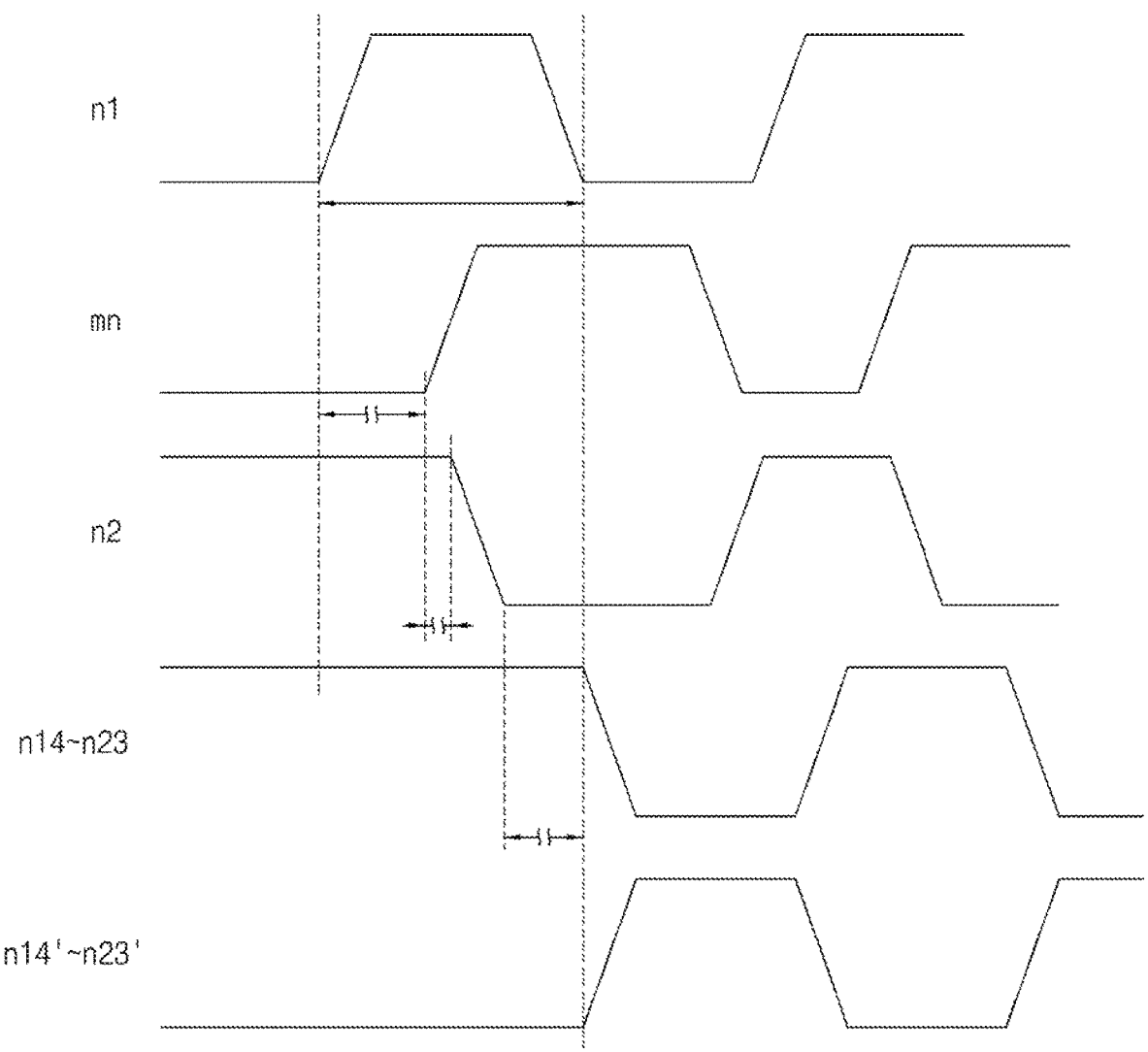
FIG. 11 is a waveform diagram for describing the operation of the clock signal delay path unit according to an example embodiment.

FIG. 11 is a waveform diagram for describing the operation of the clock signal delay path unit according to an example embodiment.

Referring to FIG. 5 to FIG. 11, a delayed clock signal DCLK having a duty ratio of 50% may be generated at the first node n1.

The delayed clock signal DCLK may be transmitted through the root signal line sl1 connected between the first node n1 and the intermediate node mn and the repeaters R connected to the root signal line sl1. At this time, a rate of signal transmission through NMOS transistors N of inverters I constituting the repeaters R connected to the root signal line sl1 may become lower than a rate of signal transmission through PMOS transistors P thereof due to change in PVT. Accordingly, transition from a "high" level to a "low" level of the delayed clock signal DCLK may be delayed, and thus a delayed clock signal DCLK having a duty ratio greater than 50% may be generated at the intermediate node mn. For example, the duty ratio may gradually increase whenever the delayed clock signal DCLK passes through the repeaters R to reach 55% at the intermediate node mn.

The delayed clock signal DCLK of the intermediate node mn may be transmitted through the multiplexer MUX. When the delayed clock signal DCLK is transmitted from the intermediate node mn through the multiplexer MUX or the duty cycle corrector DCC and the multiplexer MUX, a change in the duty ratio due to change in PVT may be ignored because the signal line is short. Accordingly, the phase of the delayed clock signal DCLK transmitted from the intermediate node mn through the multiplexer MUX or the duty cycle corrector DCC and the multiplexer MUX is inverted through the inverting repeater IR, and thus an inverted delayed clock signal DCLKB having a duty ratio of 45% may be generated at the second node n2.

The inverted delay clock signal DCLKB may be transmitted via repeaters R through branch signal lines from the second node n2 to the fourth branch nodes (the fourteenth node n14 to the twenty-third node n23). At this time, a rate of signal transmission through NMOS transistors N of inverters I constituting the repeaters R present on the first to fourth signal lines from the second node n2 to the fourth branch nodes (the fourteenth node n14 to the twenty-third node n23) may become lower than a rate of signal transmission through PMOS transistors P thereof due to change in PVT. Accordingly, transition from a "high" level to a "low" level of the inverted delayed clock signal DCLKB having a duty ratio of 45% at the second node n2 is delayed, and thus an inverted delayed clock signal DCLKB having a duty ratio of 50% may be generated at each of the fourth branch nodes (the fourteenth node n14 to the twenty-third node n23).

Additionally, the phase splitters PS and selectors MUX may invert the phase of the inverted delay clock signal DCLKB having a duty ratio of 50% at the fourth branch nodes (the fourteenth node n14 to the twenty-third node n23) to generate internal clock signals ick1 to ick8, an output data strobe signal dqso, and an inverted output data strobe signal dqsob, which have a duty ratio of 50%. For example, when the output nodes of the phase splitters PS and selectors MUX connected to the fourteenth node n14 to the twenty-third node n23 are n14' to n23', the internal clock signals ick1 to ick8, the output data strobe signal dqso, and the inverted output data strobe signal dqsob, which have a duty ratio of 50%, may be generated at the output nodes n14' to n23'.

Figure 12:
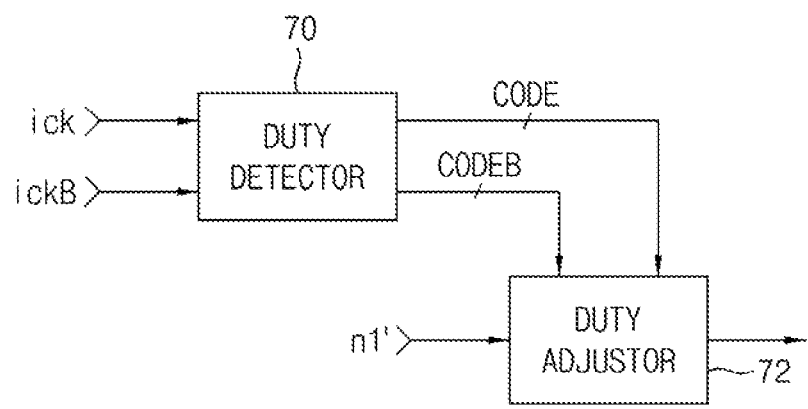
FIG. 12 is a block diagram showing a configuration of a duty cycle corrector according to an example embodiment.

FIG. 12 is a block diagram showing a configuration of a duty cycle corrector according to an example embodiment. A function of each block shown in FIG. 12 will be described as follows.

The duty cycle corrector (DCC) may include a duty detector 70 and a duty adjustor 72.

The duty detector 70 may generate a first pump voltage and a second pump voltage (e.g., by performing a pumping operation in response to internal clock signals ick and ickB having a phase difference of 180 degrees), compare the first pump voltage with the second pump voltage to generate a comparison output signal, and generate a code CODE (having a predetermined number of bits) and an inverted code CODEB (having a predetermined number of bits) by performing an up-counting or down-counting operation according to the comparison output signal.

The duty adjustor 72 may adjust slopes of a rising transition and a falling transition of the delayed clock signal DCLK of the intermediate node mn in response to the code CODE and the inverted code CODEB, to control the duty ratio of the delayed clock signal DCLK.

Figure 13:
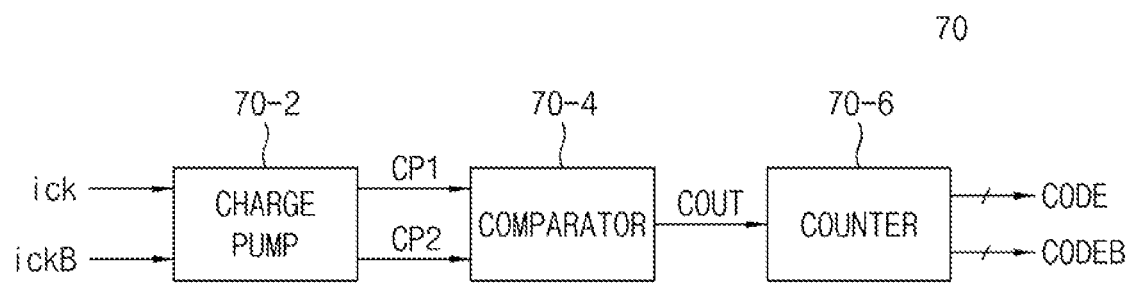
FIG. 13 is a block diagram showing a configuration of the duty detector according to an example embodiment.

FIG. 13 is a block diagram showing a configuration of the duty detector according to an example embodiment. A function of each block shown in FIG. 13 will be described as follows.

The duty detector 70 may include a charge pump 70-2, a comparator 70-4, and a counter 70-6.

The charge pump 70-2 may generate a first pump voltage CP1 by performing a pumping operation in response to the internal clock signal ick, and generate a second pump voltage CP2 by performing a pumping operation in response to the inverted internal clock signal ickB.

The comparator 70-4 may compare the first pump voltage CP1 with the second pump voltage CP2, to generate a comparison output signal COUT.

The counter 70-6 may generate a code CODE (having a predetermined number of bits) and an inverted code CODEB (having a predetermined number of bits) by performing an up-counting or down-counting operation in response to the comparison output signal COUT.

Figure 14:
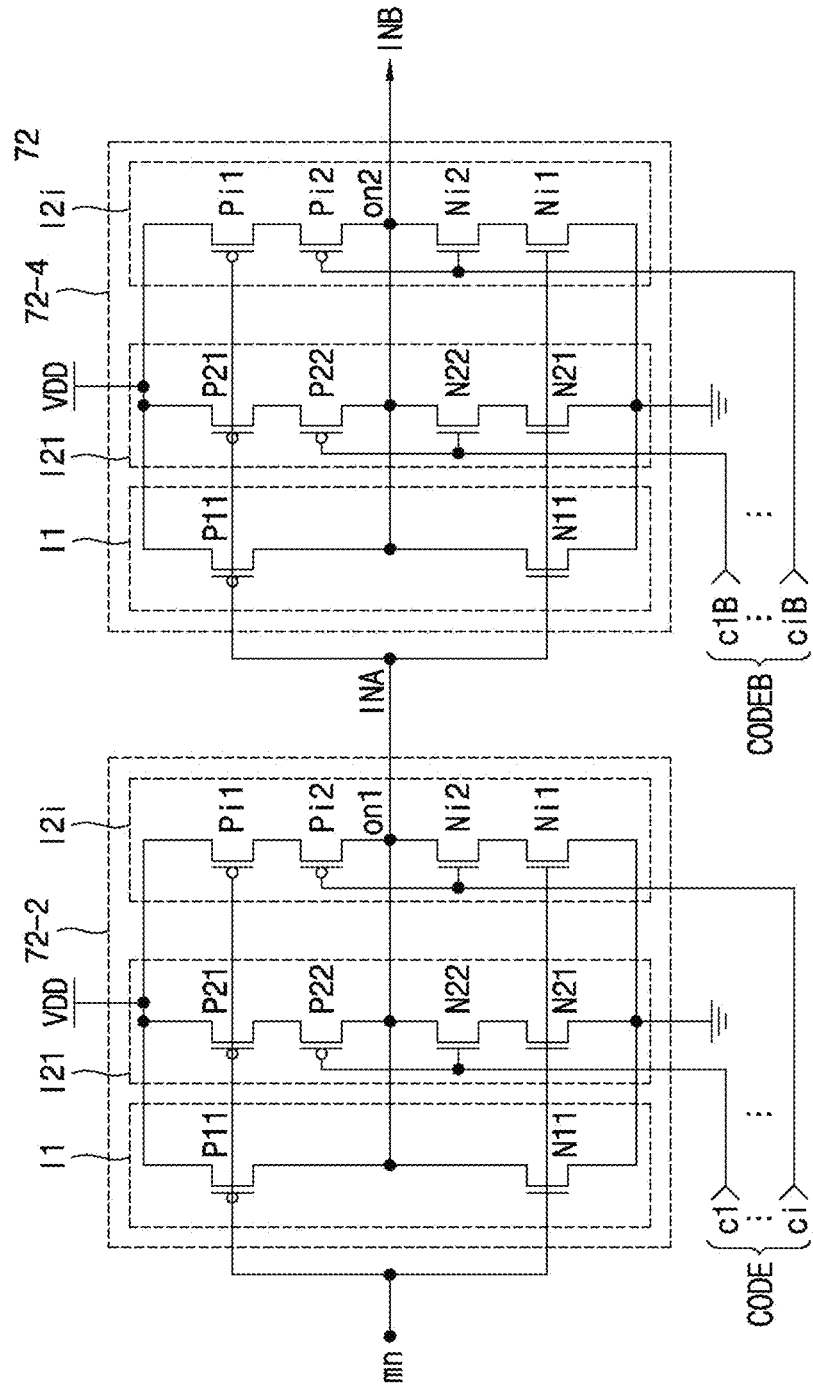
FIG. 14 is a circuit diagram showing a configuration of the duty adjustor according to an example embodiment.

FIG. 14 is a circuit diagram showing a configuration of the duty adjustor according to an example embodiment.

Referring to FIG. 14, the duty adjustor 72 may include a first adjustor 72-2 and a second adjustor 72-4 connected in series.

Each of the first adjustor 72-2 and the second adjustor 72-4 may include i+1 inverters, that is, a first inverter I1 and i second inverters I21 to I2i, connected in parallel.

The first inverter I1 may include a first PMOS transistor P11 connected between a power supply voltage VDD and a first or second output node on1 or on2, and a first NMOS transistor N11 connected between the first or second output node on1 or on2 and a ground voltage.

Each of the second inverters I21 to I2i may include a second PMOS transistor P21, ..., or Pi1 and a third PMOS transistor P22, ..., or Pi2 connected in series between the power supply voltage VDD and the first or second output node on1 or on2, and a third NMOS transistor N22, ..., or Ni2 and a second NMOS transistor N21, ..., or Ni1 connected in series between the first or second output node on1 or on2 and the ground voltage.

The first inverter I1 of the first adjustor 72-2 may invert the delayed clock signal DCLK of the intermediate node mn and output an inverted clock signal INA having a phase opposite to that of the delayed clock signal DCLK to the first output node on1.

Each of the second inverters I21 to I2i of the first adjustor 72-2 may adjust the slope of rising transition or falling transition of the inverted clock signal INA in response to the delayed clock signal DCLK of the intermediate node mn and a corresponding bit c1, ..., or ci of the i-bit code CODE to control the duty ratio of the inverted clock signal INA.

The first inverter I1 of the second adjustor 72-4 may invert the inverted clock signal INA and output a clock signal INB having the same phase as that of the delayed clock signal DCLK to the second output node on2.

Each of the second inverters I21 to I2i of the second adjustor 72-4 may adjust the slope of rising transition or falling transition of the clock signal INB in response to the inverted clock signal INA and a corresponding bit c1B, ..., or ciB of the i-bit inverted code CODEB to control the duty ratio of the clock signal INB.

Figure 15A:
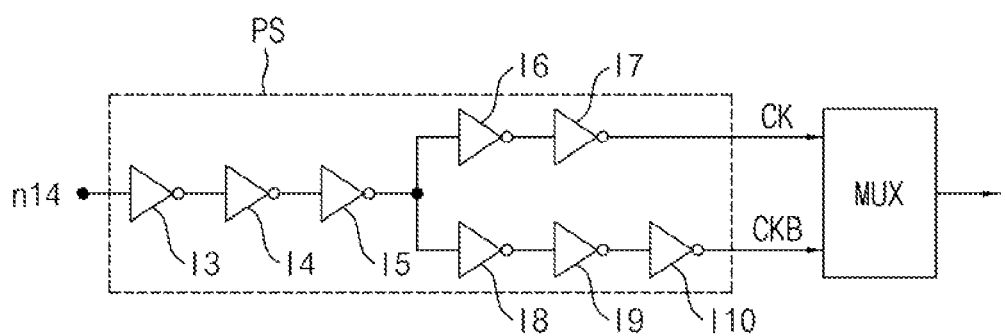
FIG. 15A and FIG. 15B are diagrams showing configurations of a phase splitter and selector according to an example embodiment.
Figure 15B:
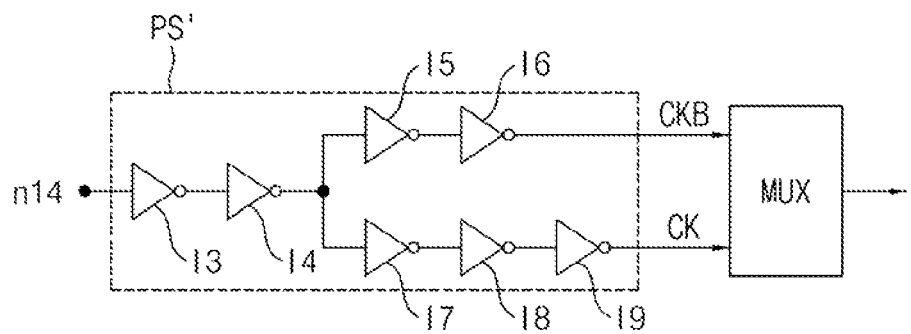

FIG. 15A and FIG. 15B are diagrams showing configurations of a phase splitter and selector according to an example embodiment.

Referring to FIG. 15A, a phase splitter PS may include third to tenth inverters I3 to I10.

The third to seventh inverters I3 to I7 may receive the inverted delayed clock signal DCLKB of the fourteenth node n14, invert the same, and output a clock signal CK having a phase opposite to that of the inverted delayed clock signal DCLKB.

The third to fifth inverters I3 to I5 and the eighth to tenth inverters I8 to I10 may receive the inverted delayed clock signal DCLKB, and output an inverted clock signal CKB having the same phase as that of the inverted delayed clock signal DCLKB.

A selector MUX may receive the clock signal CK and the inverted clock signal CKB, select the clock signal CK in response to the inverted clock signal CKB, and select the inverted clock signal CKB in response to the clock signal CK.

Referring to FIG. 15B, a phase splitter PS' may include third to ninth inverters I3 to I9.

The third to sixth inverters I3 to I6 may receive the inverted delayed clock signal DCLKB of the fourteenth node n14, invert the same, and output an inverted clock signal CKB having the same phase as that of the inverted delayed clock signal DCLKB.

The third, fourth, and seventh to ninth inverters I3, I4 and I7 to I9 may invert the inverted delayed clock signal DCLKB and output a clock signal CK having a phase opposite to that of the inverted delayed clock signal DCLKB.

The selector MUX may receive the inverted clock signal CKB and the clock signal CK, select the inverted clock signal CKB in response to the clock signal CK, and select the clock signal CKB in response to the inverted clock signal CKB.

Figure 16:
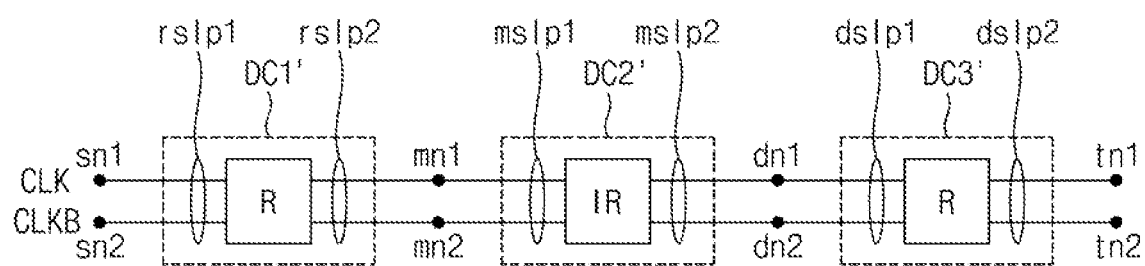
FIG. 16 is a diagram showing a clock signal delay path unit according to an example embodiment.

FIG. 16 is a diagram showing a clock signal delay path unit according to an example embodiment.

The clock signal delay path unit may include a first delay cell DC1', a second delay cell DC2', and a third delay cell DC3'.

The clock signal delay path unit shown in FIG. 16 may be the same as the clock signal delay path unit shown in FIG. 1 except that all nodes (that is, the start node sn, the intermediate node mn, the branch node dn, and the target node tn) are provided in pairs (that is, a start node pair sn1 and sn2, an intermediate node pair mn1 and mn2, a branch node pair dn1 and dn2, and a target node pair tn1 and tn2), all signal lines (that is, the first root signal line rsl1, the second root signal line rsl2, the first intermediate signal line msl1, the second intermediate signal line msl2, the first branch signal line dsl1, and the second branch signal line dsl2) are provided in pairs (that is, a first root signal line pair rslp1, a second root signal line pair rslp2, a first intermediate signal line pair mslp1, a second intermediate signal line pair mslp2, a first branch signal line pair dslp1, and a second branch signal line pair dslp2), and a clock signal pair CLK and CLKB is transmitted instead of the clock signal CLK.

The operation of the clock signal delay path unit shown in FIG. 16 may be easily understood by referring to the operation of the clock signal delay path unit of FIG. 1.

Figure 17A:
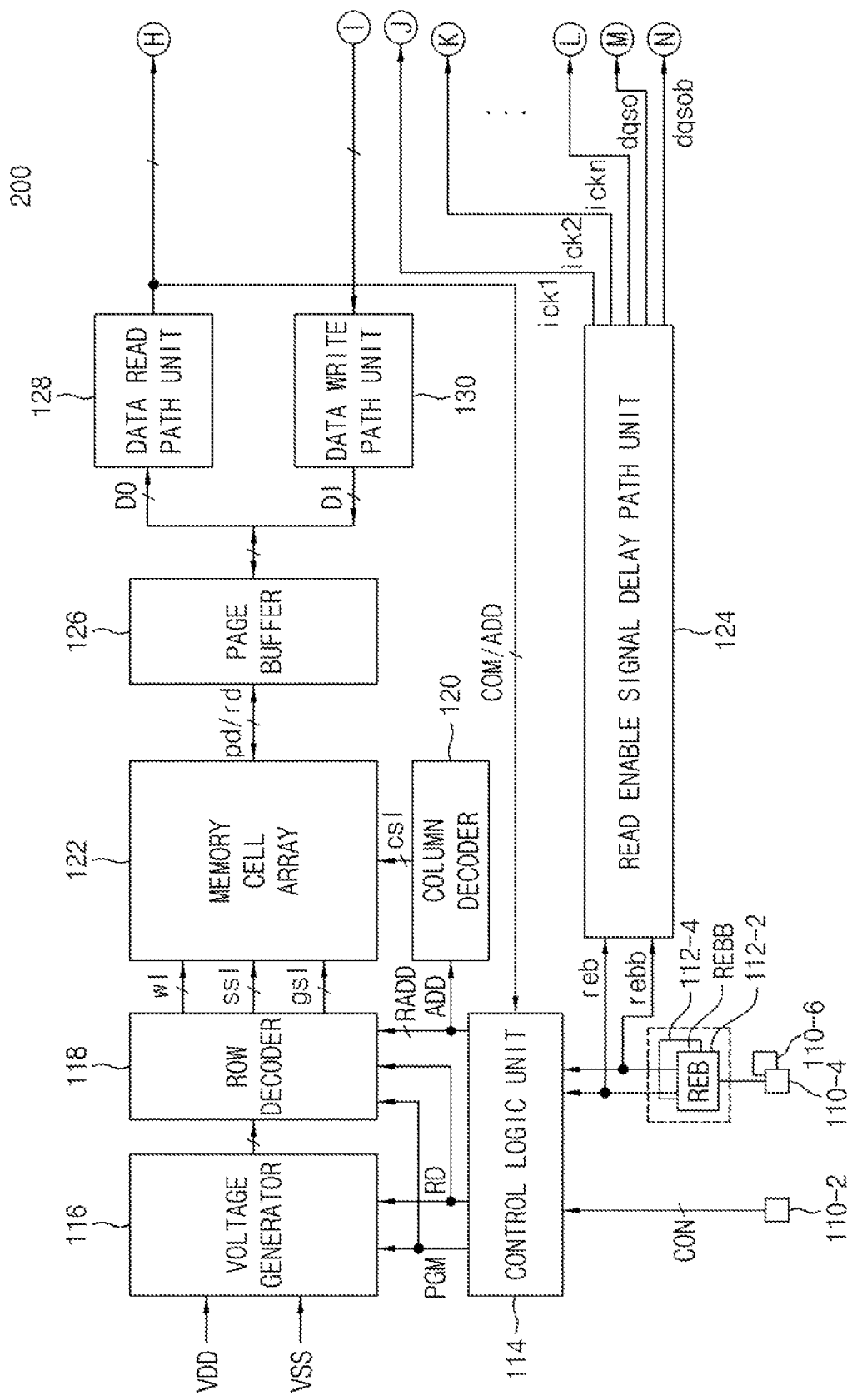
FIG. 17A and FIG. 17B are block diagrams showing a semiconductor memory device according to an example embodiment.
Figure 17B:
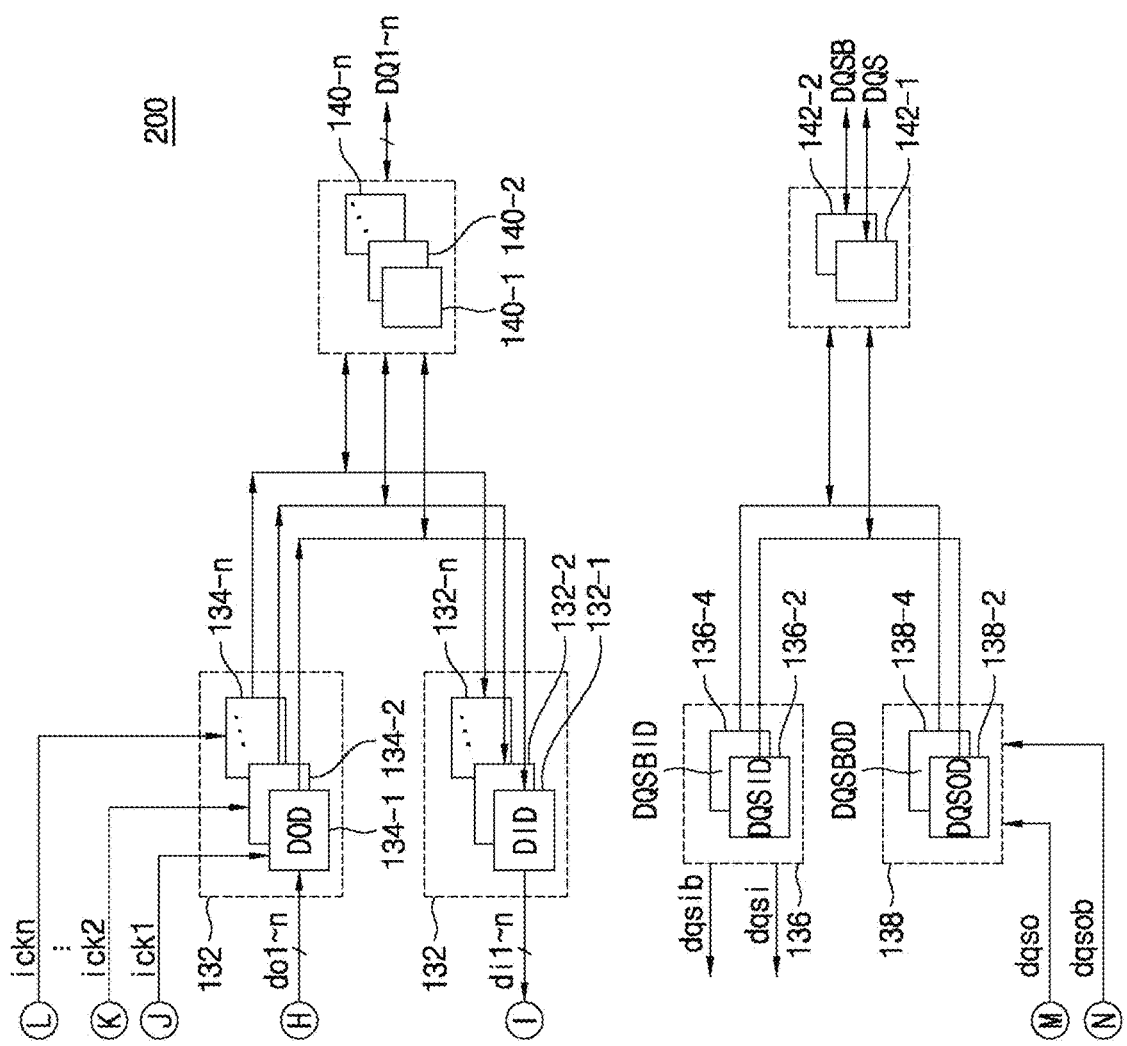

FIG. 17A and FIG. 17B are block diagrams showing a semiconductor memory device 200 according to an example embodiment. Each block shown in FIG. 17A and FIG. 17B will be described as follows.

The semiconductor memory device 200 may include control signal terminals 110-2, a read enable signal terminal 110-4, an inverted read enable signal terminal 110-6, a read enable signal buffer (REB) 112-2, an inverted read enable signal buffer (REBB) 112-4, a control logic unit 114, a voltage generator 116, a row decoder 118, a column decoder 120, a memory cell array 122, a read enable signal delay path unit 124, a page buffer 126, a data read path unit 128, a data write path unit 130, a data input unit 132, a data output unit 134, a data strobe signal input unit 136, a data strobe signal output unit 138, data terminals 140-1 to 140-n, a data strobe signal terminal 142-1, and an inverted data strobe signal terminal 142-2.

The data input unit 132 may include n data input drivers (DIDs) 132-1 to 132-n.

The data output unit 134 may include n data output drivers (DODs) 134-1 to 134-n.

The data strobe signal input unit 136 may include a data strobe signal input driver (DQSID) 136-2 and an inverted data strobe signal input driver (DQSBID) 136-4.

The data strobe signal output unit 138 may include a data strobe signal output driver (DQSOD) 138-2 and an inverted data strobe signal output driver (DQSBOD) 138-4.

The control signal terminals 110-2 may receive control signals CON (e.g., a command enable signal CE, a write enable signal WE, a command latch enable signal CLE, and an address latch enable signal ALE (not shown)).

The read enable signal terminal 110-4 may receive a read enable signal RE.

The inverted read enable signal terminal 110-6 may receive an inverted read enable signal REB.

The read enable signal buffer (REB) 112-2 may buffer the read enable signal RE, and output a buffered read enable signal reb.

The inverted read enable signal buffer (REBB) 112-4 may buffer the inverted read enable signal REB, and output a buffered inverted read enable signal rebb.

The control logic unit 114 may generate a program command PGM and a read command RD in response to the control signals CON, the buffered read enable signal reb, and the buffered inverted read enable signal rebb. The control logic unit 114 may receive a command COM in response to the command latch enable signal CLE and the write enable signal WE, and may receive an address ADD in response to the address latch enable signal ALE and the write enable signal WE or receive the address ADD in response to the address latch enable signal ALE, the buffered read enable signal reb, and the buffered inverted read enable signal rebb.

The voltage generator 116 may receive the power supply voltage VDD and the ground voltage VSS, generate driving voltages DV for a program operation in response to the program command PGM, and generate driving voltages DV for a read operation in response to the read command RD.

The row decoder 118 may receive the driving voltages DV for a program operation in response to the program command PGM, and decode a row address RADD to drive a plurality of word line selection signals wl, a plurality of source line selection signals ssl, and a plurality of ground selection signals gsl, or may receive the driving voltages DV for a read operation in response to the read command RD, and decode the row address RADD to drive the plurality of word line selection signals wl, the plurality of source line selection signals ssl, and the plurality of ground selection signals gsl.

The column decoder 120 may receive and decode a column address CADD to generate a plurality of column selection signals csl.

The memory cell array 122 may include a plurality of memory cells. The memory cell array 122 may program program data pd into memory cells (selected by a plurality of word line selection signals w1, a plurality of source line selection signals ssl, a plurality of ground selection signals gsl, and a plurality of column selection signals csl) in response to the program command PGM, and may output read data rd from selected memory cells in response to the read command RD. The plurality of memory cells may be flash memory cells, the memory cell array 122 may be a flash memory cell array, and the semiconductor memory device 200 may be a flash memory device.

The read enable signal delay path unit 124 may transmit the buffered read enable signal reb and the buffered inverted read enable signal rebb through signal line pairs in response to the read command RD, to generate an output data strobe signal dqso, an inverted output data strobe signal dqsob, and n internal clock signals ick1 to ickn.

The read enable signal delay path unit 124 may correct the duty ratios of the buffered read enable signal reb and the buffered inverted read enable signal rebb, which may be changed due to change in PVT in the signal line pairs through which the buffered read enable signal reb and the buffered inverted read enable signal rebb are transmitted. For example, even if the duty ratios of the buffered read enable signal reb and the buffered inverted read enable signal rebb increase (or decrease) in signal line pairs due to change in PVT, the read enable signal delay path unit 124 may decrease (or increase) the duty ratios of the buffered read enable signal ref and the buffered inverted read enable signal rebb to correct the duty ratios by inverting the phases of the buffered read enable signal reb and the buffered inverted read enable signal rebb at midpoints of the signal line pairs. Accordingly, the duty ratios of the output data strobe signal dqso, the inverted output data strobe signal dqsob, and the n internal clock signals ick1 to ickn generated from the read enable signal delay path unit 124 may be corrected.

The page buffer 126 may buffer the write data DI in response to the program command PGM to output the same as program data pd, and may buffer the read data rd in response to the read command RD to output the same as read data DO.

The data write path unit 128 may convert input data di into parallel data in response to the program command PGM, to output the write data DI.

The data read path unit 130 may convert the read data DO into serial data in response to the read command RD, to output output data do.

The data input drivers 132-1 to 132-n may be connected to the n data terminals 140-1 to 140-n, and may drive n pieces of data DQ1 to DQn to generate n pieces of input data di1 to din, respectively.

The data output drivers 134-1 to 134-n may be connected to the n data terminals 140-1 to 140-n, and may drive n pieces of output data do1 to don to generate n pieces of data DQ1 to DQn, respectively.

The data strobe signal input driver 136-2, the inverted data strobe signal input driver 136-4, the data strobe signal output driver 138-2, and the inverted data strobe signal output driver 138-4 may execute the same functions as those of the data strobe signal input driver 36-1, the inverted data strobe signal input driver 36-2, the data strobe signal output driver 34-1, and the inverted data strobe signal output driver 34-2 described with reference to FIG. 2B.

An output node of the read enable signal buffer 112-2 and an inverted output node of the inverted read enable signal buffer 112-4 of the semiconductor memory device 200 shown in FIG. 17A and FIG. 17B may correspond to the start node pair sn1 and sn2 shown in FIG. 16. The read enable signal delay path unit 124 of the semiconductor memory device 200 shown in FIG. 17A and FIG. 17B may differ from the clock signal delay path units 18-4, 18-4', and 18-4" of the semiconductor memory device 100 (in which each signal line is a single signal line) described with reference to FIG. 5 to FIG. 7, in that the signal lines may be provided in pairs as shown in FIG. 16.

Similarly, the read enable signal delay path unit 124 may differ from the clock signal delay path units 18-4, 18-4', and 18-4" of the semiconductor memory device 100 (in which each of the first node n1 and the fourth branch nodes (the fourteenth to twenty-third nodes n14 to n23) is a single node) described with reference to FIG. 5 to FIG. 7, in that the nodes may be provided in pairs as shown in FIG. 16.

The phases of the buffered read enable signal reb and the buffered inverted read enable signal rebb are inverted by the inverting repeater IR as shown in FIG. 16. To restore the phases of the buffered read enable signal reb and the buffered inverted read enable signal rebb, the buffered read enable signal reb and the buffered inverted read enable signal rebb may be applied to the first node pair in a crossing manner.

As another example, selectors may be provided between the pairs of the fourth branch nodes (the fourteenth to twenty-third nodes n14 to n23), the data output drivers 134-1 to 134-n, the data strobe signal input driver 136-2, and the inverted data strobe signal input driver 136-4. The selectors may be configured to alternately output a group of the inverted internal clock signals, the inverted output data strobe signal, and the output data strobe signal and a group of the internal clock signals, the output data strobe signal, and the inverted output data strobe signal among the internal clock signal pairs, the output data strobe signal pair, and the inverted output data strobe signal pair.

Figure 18A:
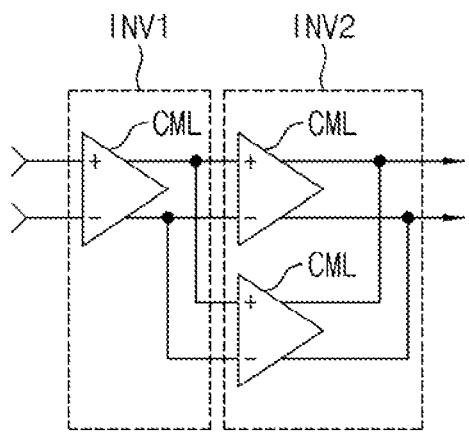
FIG. 18A and FIG. 18B are diagrams showing configurations of a repeater R according to an example embodiment.
Figure 18B:
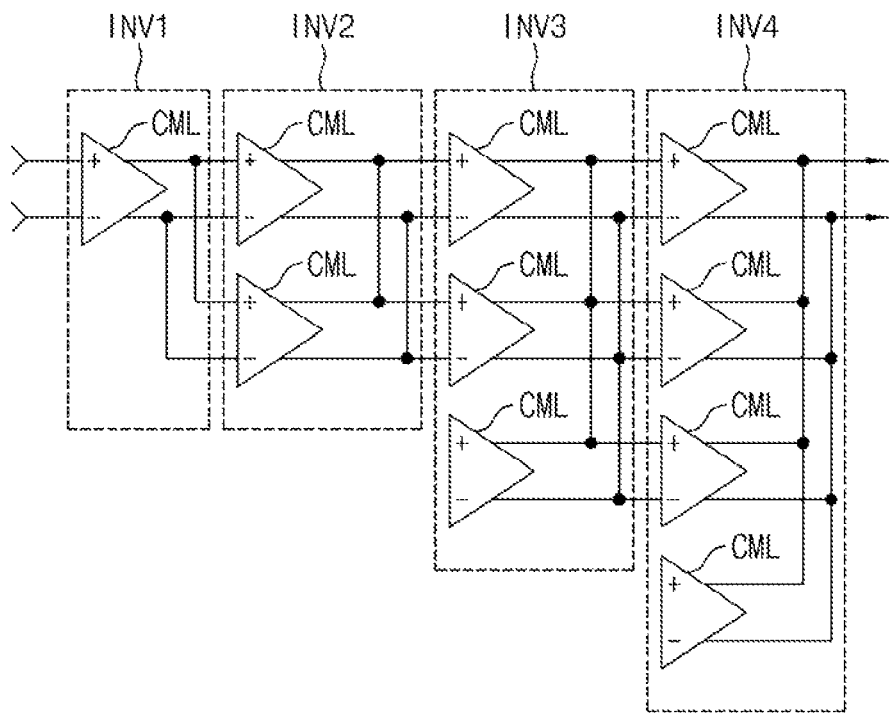

FIG. 18A and FIG. 18B are diagrams showing configurations of a repeater R according to an example embodiment.

FIGS. 18A and 18B correspond to a case where the buffered read enable signal reb and the buffered inverted read enable signal rebb shown in FIG. 17A and FIG. 17B are transmitted.

Referring to FIG. 18A, the repeater R may include two inverting circuits INV1 and INV2 connected in series.

The inverting circuit INV1 may include a single inverting amplifier CML.

The inverting circuit INV2 may include two inverting amplifiers CML connected in parallel.

The inverting amplifiers CML may be inverting current mode logic differential amplifiers.

The inverting circuit INV2 may have a size two times greater than the inverting circuit INV1. In another implementation, different from what is shown, the inverting circuit INV2 may have a size the same as or three or more times greater than the inverting circuit INV1.

Referring to FIG. 18B, the repeater R may include four inverting circuits INV1 to INV4 connected in series.

The inverting circuit INV1 and the inverting circuit INV2 may have the same configuration as those described with reference to FIG. 18A.

The inverting circuit INV3 may include four inverting amplifiers CML connected in parallel. The inverting circuit INV3 may have a size four times greater than the inverting circuit INV1.

The inverting circuit INV4 may include six inverting amplifiers CML connected in parallel. The inverting circuit INV4 may have a size six times greater than the inverting circuit INV1.

The inverting amplifiers CML may be inverting current mode logic differential amplifiers.

In another implementation, different from what is shown, the inverting circuit INV1 and the inverting circuit INV2 have the same size, the inverting circuit INV3 may have a size two times or more greater than the inverting circuit INV1, and the inverting circuit INV4 may have a size three or more times greater than the inverting circuit INV1.

As described with reference to FIG. 18A and FIG. 18B, the repeater R may include an even number of inverting circuits connected in series, and may be configured such that the size of an inverting circuit is the same as or greater than the size of an inverting circuit in the previous stage.

Figure 19A:
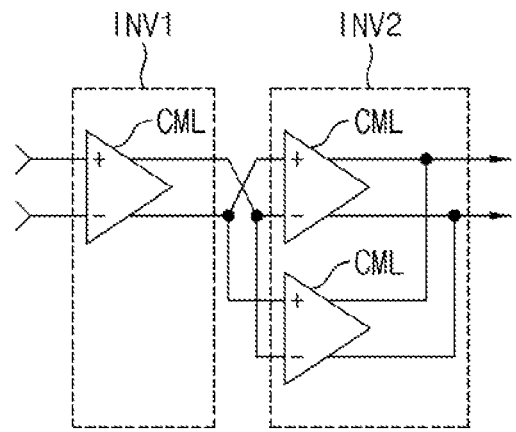
FIG. 19A and FIG. 19B are diagrams showing configurations of an inverting repeater according to an example embodiment.
Figure 19B:
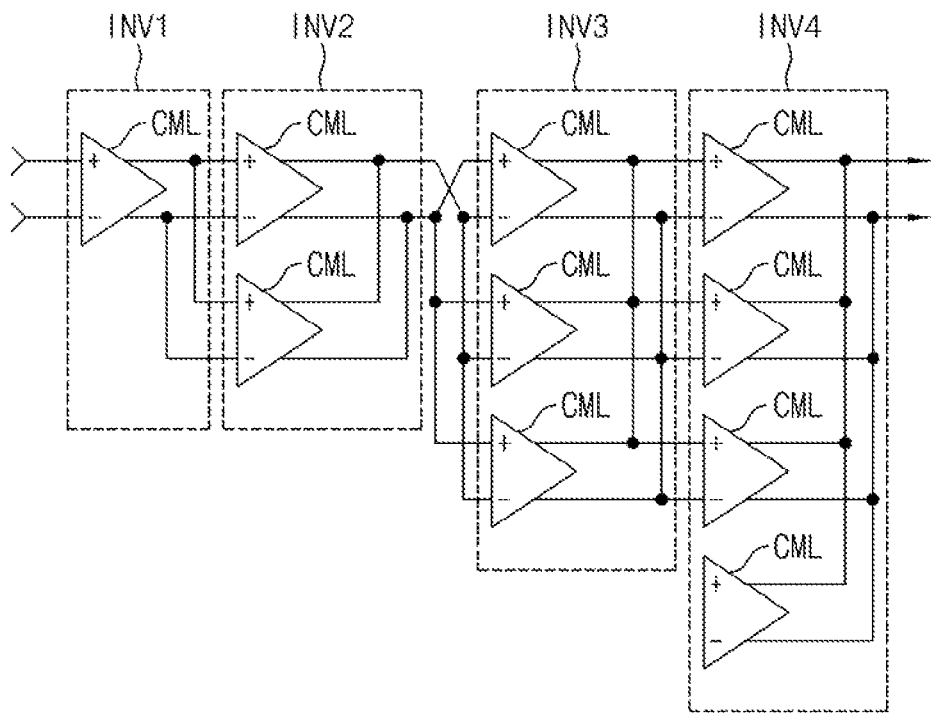

FIG. 19A and FIG. 19B are diagrams showing configurations of an inverting repeater according to an example embodiment.

Referring to FIG. 19A, the inverting repeater IR may have the same configuration as that of the inverting repeater IR shown in FIG. 18A except that the output signal line pair of the inverting circuit INV1 of the inverting repeater IR of FIG. 18A and the input signal line pair of the inverting circuit INV2 are cross-coupled.

Referring to FIG. 19B, the inverting repeater IR may have the same configuration as that of the repeater R shown in FIG. 18B except that the output signal line pair of the inverting circuit INV2 of the inverting repeater IR of FIG. 18B and the input signal line pair of the inverting circuit INV3 are cross-coupled.

In another implementation, different from what is shown, the inverting repeater IR may be configured by cross-coupling the output signal line pair of the inverting circuit INV1 of FIG. 19B and the input signal line pair of the inverting circuit INV2.

As described with reference to FIG. 19A and FIG. 19B, the inverting repeater IR may include an even number of inverting circuits connected in series, and may be configured by cross-coupling (between two sequentially connected inverting circuits) the output signal line pair of the inverting circuit in the previous stage to the input signal line pair of the inverting circuit in the subsequent stage. Accordingly, the inverting repeater IR may invert the phase of an input signal. Further, the inverting repeater IR may be configured such that the size of the inverting circuit in the subsequent stage is the same as or greater than the size of the inverting circuit in the previous stage.

Figure 20:
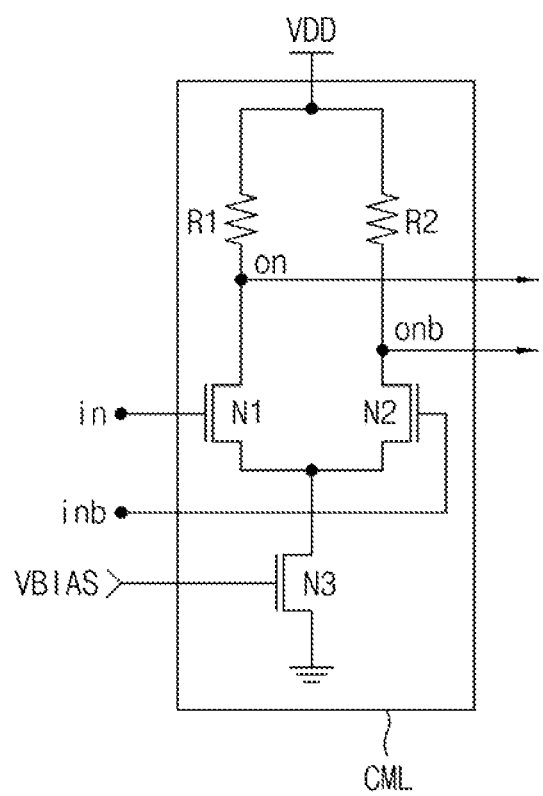
FIG. 20 is a diagram showing a configuration of an inverting current mode logic differential amplifier according to an example embodiment.

FIG. 20 is a diagram showing a configuration of an inverting current mode logic differential amplifier according to an example embodiment.

Referring to FIG. 20, an inverting current mode logic differential amplifier CML may include a first resistor R1 (connected between a power supply voltage VDD and an inverting output node onb), a second resistor R2 (connected between the power supply voltage VDD and an output node on), a first NMOS transistor N1 (having a drain connected to the inverting output node onb, a gate connected to an input node in, and a source connected to an intermediate node mn), a second NMOS transistor N2 (having a drain connected to the output node on, a gate connected to an inverting input node inb, and a source connected to the intermediate node mn), and a third NMOS transistor N3 (having a drain connected to the intermediate node mn, a gate to which a bias voltage VBIAS is applied, and a source connected to a ground voltage).

The inverting current mode logic differential amplifier CML may be enabled when the third NMOS transistor N3 is turned on in response to the bias voltage VBIAS.

When the inverting current mode logic differential amplifier CML is enabled and the voltage level of an input signal applied to the input node in is higher than the voltage level of an inverting input signal applied to the inverting input node inb, the current flowing through the first NMOS transistor N1 is greater than the current flowing through the second NMOS transistor N2, and thus the level of the inverting output node onb becomes lower than the level of the output node on. That is, an inverted output signal at a "low" level and an output signal at a "high" level may be generated.

On the other hand, when the inverting current mode logic differential amplifier CML is enabled and the voltage level of the input signal applied to the input node in is lower than the voltage level of the inverting input signal applied to the inverting input node inb, an output signal at a "low" level and an inverted output signal at a "high" level may be generated.

Although not shown, the clock signal delay path unit of the embodiments according to an example embodiment may be used to delay a data strobe signal pair (a data strobe signal DQS and an inverted data strobe signal DQSB) and transmit the same without signal attenuation.

By way of summation and review, a clock signal delay path unit may include repeaters on signal lines in order to transmit a delayed clock signal without signal attenuation that may result from a long length of signal lines from an output node (i.e., a signal source) of a delay locked loop (that generates the delayed clock signal) to target blocks.

As described above, embodiments may provide a clock signal delay path unit configured to correct change in a duty ratio of a clock signal in signal lines (e.g., due to changes in a process, a voltage, and a temperature), and a semiconductor memory device including the same.

Embodiments may provide a clock signal delay path unit configured to correct a duty ratio of a clock signal by inverting the phase of the clock signal at a position where a change in a total duty ratio occurring in signal lines (e.g., due to change in a process, a voltage, and a temperature) is reduced by half. Accordingly, the reliability of the operation of a semiconductor memory device including the clock signal delay path unit may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An operating method of a memory device, comprising, receiving a read enable signal through a first node;
delaying the read enable signal using a first delay path connected between the first node and an intermediate node;

delaying the delayed signal using a second delay path connected between the intermediate node and a second node; and generating a data strobe signal by delaying the delayed signal from the second delay path using a third delay path connected between the second node and a third node, wherein the delaying of the delayed signal includes:

correcting, by a duty cycle corrector, a duty ratio of the delayed signal of the intermediate node using an internal clock signal pair, selecting, by a multiplexer, the delayed signal of the intermediate node or the corrected signal from the duty cycle corrector in response to a selection signal, and inverting, by an inverting repeater, a phase of the selected signal from the multiplexer.

2. The operating method as claimed in claim 1, wherein the delaying of the read enable signal using the first delay path includes delaying, by a plurality of repeaters connected in series, the read enable signal, and wherein the delaying of the delayed signal using the third delay path includes delaying by a plurality of repeaters connected in series, the delayed signal from the second delay path.

3. The operating method as claimed in claim 1, wherein the delaying of the delayed signal using the second delay path includes inverting, by an odd number of inverters connected in series, the delayed signal from the first delay path.

4. The operating method as claimed in claim 3, wherein the odd number of inverters is 5.

5. The operating method as claimed in claim 1, wherein the inverting pea ter of the phase of the selected signal includes:

inverting, by an inverter, the phase of the selected signal from the multiplexer; and delaying by a plurality of repeaters connected in series, the inverted signal.

6. The operating method as claimed in claim 1, wherein the selecting of the delayed signal or the corrected signal includes generating the selection signal according to a set code in a mode register set.

7. The operating method as claimed in claim 1, wherein the generating of the data strobe signal includes:

delaying, by a plurality of repeaters connected in series, the delayed signal of the second node;

splitting, by a phase splitter, phases of the delayed signal from the plurality of repeaters, and generating a clock signal and an inverted clock signal; and selecting, by a selector, one of the clock signal and the inverted clock signal as the data strobe signal.

8. The operating method as claimed in claim 7, wherein the splitting of the phases of the delayed signal from the plurality of repeaters includes inverting the delayed signal from the plurality of repeaters and splitting the phases of the delayed signal from the plurality of repeaters.

9. The operating method as claimed in claim 7, wherein the selecting of one of the clock signal and the inverted clock signal includes:

selecting the clock signal in response to the inverted clock signal, or selecting the inverted clock signal in response to the clock signal.

10. A memory device, comprising:

a first delay path connected between a first node with and an intermediate node and configured to receive a read enable signal through the first node and delay the read enable signal;

a second delay path connected between the intermediate node and a second node and configured to delay the delayed signal from the first delay path; and a third delay path connected between the second node and a third node and configured to generate a data strobe signal by delaying the delayed signal from the second delay path, wherein the second delay path includes:

a duty cycle corrector configured to correct a duty ratio of the delayed signal of the intermediate node using an internal clock signal pair, a multiplexer configured to select the delayed signal of the intermediate node or the corrected signal from the duty cycle corrector in response to a selection signal, and an inverting repeater configured to invert a phase of the selected signal from the multiplexer.

11. The memory device as claimed in claim 10, wherein the inverting repeater includes:

an inverter configured to invert the phase of the selected signal from the multiplexer; and a plurality of repeaters connected in series and configured to delay the inverted delayed signal.

12. The memory device as claimed in claim 10, wherein the third delay path includes:

a plurality of repeaters connected in series and configured to delay the delayed signal of the second node;

a phase splitter configured to split phases of the delay delayed signal from the plurality of repeaters and generate a clock signal and an inverted clock signal; and a selector configured to select one of the clock signal and the inverted clock signal as the data strobe signal.

13. The memory device as claimed in claim 12, wherein the phase splitter is configured to invert the delayed signal from the plurality of repeaters and split phases of the in delayed signal from the plurality of repeaters.

14. A memory device, comprising:

a plurality of data strobe signal drivers;

a delay locked loop circuit configured to generate a delayed clock signal that is delay-locked to an external clock signal; and a clock signal delay path configured to delay the delayed clock signal, generate internal clock signals, and transmit the internal signal clock signals to the plurality of data strobe signal drivers, wherein the clock signal delay path includes:

a first delay path connected between a first node with and an intermediate node and configured to receive the delayed clock signal through the first node and delay the read delayed clock signal;

a second delay path connected between the intermediate node and a second node and configured to delay the delayed signal from the first delay path; and a third delay path connected between the second node and a third node and configured to generate a data strobe signal by delaying the delayed signal from the second delay path, and wherein the second delay path is configured to invert a phase of the delayed signal from the first delay path.

15. The memory device as claimed in claim 14, wherein the second delay path includes:

a duty cycle corrector configured to correct a duty ratio of the delayed signal of the intermediate node using an internal clock signal pair;

a multiplexer configured to select the delayed signal of the intermediate node or the corrected signal from the duty cycle corrector in response to a selection signal; and an inverting repeater configured to invert the phase of the selected signal from the multiplexer.

16. The memory device as claimed in claim 15, wherein the inverting repeater includes:

an inverter configured to invert the phase of the selected signal from the multiplexer; and a plurality of repeaters connected in series and configured to delay the inverted signal.

17. The memory device as claimed in claim 14, wherein the third delay path includes:

a plurality of repeaters connected in series and configured to delay the delayed signal of the second node;

a phase splitter configured to split phases of the delay delayed signal from the plurality of repeaters and generate a clock signal and an inverted clock signal; and a selector configured to select one of the clock signal and the inverted clock signal as a data strobe signal.

18. The memory device as claimed in claim 17, wherein the phase splitter is configured to invert the delayed signal from the plurality of repeaters and split phases of the delayed signal from the plurality of repeaters.

* * * * *